United States Patent
Qiu et al.

(10) Patent No.: US 12,217,675 B2
(45) Date of Patent: Feb. 4, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanyou Qiu, Beijing (CN); Yao Huang, Beijing (CN); Qiwei Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/791,814

(22) PCT Filed: Apr. 30, 2021

(86) PCT No.: PCT/CN2021/091627
§ 371 (c)(1),
(2) Date: Jul. 8, 2022

(87) PCT Pub. No.: WO2022/227043
PCT Pub. Date: Nov. 3, 2022

(65) Prior Publication Data
US 2024/0177665 A1    May 30, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01);
(Continued)

(58) Field of Classification Search
CPC ............... H10K 59/131; G09G 3/3233; G09G 2320/0233; G09G 2300/0842; G09G 2310/08; G09G 2300/0819
See application file for complete search history.

(56) References Cited

U.S. PATENT DOCUMENTS

| 5,285,302 A | 2/1994 | Wu |
| 10,229,964 B2 | 3/2019 | Kim et al. |

(Continued)

FOREIGN PATENT DOCUMENTS

| CN | 107301831 A | 10/2017 |
| CN | 107564412 A | 1/2018 |

(Continued)

*Primary Examiner* — Doon Y Chow
(74) *Attorney, Agent, or Firm* — Scully, Scott, Muprhy & Presser, P.C.

(57) ABSTRACT

A display substrate and a display device are provided. The display substrate includes a first display region and a first region at least partially surrounding the first display region; the first display region includes first light-emitting elements, the first region includes first pixel circuits and at least one first capacitance compensation structure, and the display substrate includes transparent wiring lines extending from the first region to the first display region; the first pixel circuit is electrically connected to the first light-emitting element through the transparent wiring line, and is configured to control a driving current flowing through the first pixel circuit, the transparent wiring line, and the first light-emitting element; and the first capacitance compensation structure is coupled to the transparent wiring line, and is configured to compensate for a parasitic capacitance caused by the transparent wiring line coupled to the first capacitance compensation structure.

18 Claims, 13 Drawing Sheets

(52) U.S. Cl.
CPC . *G09G 2300/0842* (2013.01); *G09G 2310/08* (2013.01); *G09G 2320/0233* (2013.01)

(56) References Cited

U.S. PATENT DOCUMENTS

| | | | |
|---|---|---|---|
| 10,354,578 | B2 | 7/2019 | Ka et al. |
| 10,367,052 | B2 | 7/2019 | Zhang et al. |
| 10,403,193 | B2 | 9/2019 | Kim et al. |
| 10,636,859 | B2 | 4/2020 | Park et al. |
| 10,847,601 | B2 | 11/2020 | Lee et al. |
| 11,100,868 | B2 | 8/2021 | Zhao et al. |
| 11,205,386 | B2 | 12/2021 | Kim et al. |
| 11,588,006 | B2* | 2/2023 | Qiu .................. H10K 59/121 |
| 11,804,176 | B2* | 10/2023 | Liu .................... H10K 59/126 |
| 11,810,504 | B2* | 11/2023 | Cheng ............... H10K 59/131 |
| 11,864,397 | B2* | 1/2024 | Zhang ............... H10K 59/131 |
| 11,935,902 | B2* | 3/2024 | Wang ..................... G09G 3/32 |
| 2018/0342572 | A1* | 11/2018 | Park .................. G09G 3/3233 |
| 2020/0258973 | A1 | 8/2020 | Park et al. |
| 2021/0028248 | A1* | 1/2021 | Kim ..................... H10K 71/00 |
| 2022/0102421 | A1* | 3/2022 | Yang ................... H10K 59/353 |
| 2023/0012412 | A1* | 1/2023 | Long ..................... H01L 21/77 |
| 2023/0157143 | A1* | 5/2023 | Huang ................ H10K 59/121 345/204 |

FOREIGN PATENT DOCUMENTS

| | | | |
|---|---|---|---|
| CN | 107871766 | A | 4/2018 |
| CN | 108010951 | A | 5/2018 |
| CN | 108461522 | A | 8/2018 |
| CN | 108598139 | A | 9/2018 |
| CN | 108933159 | A | 12/2018 |
| CN | 109061975 | A | 12/2018 |
| CN | 110649080 | A | 1/2020 |
| CN | 110660837 | A | 1/2020 |
| CN | 110783345 | A | 2/2020 |
| CN | 111477672 | A | 7/2020 |
| CN | 111834425 | * | 10/2020 |
| CN | 111834425 | A | 10/2020 |
| CN | 211789021 | U | 10/2020 |
| CN | 112151592 | A | 12/2020 |
| CN | 111477672 | * | 12/2022 |

* cited by examiner

DISPLAY SUBSTRATE AND DISPLAY DEVICE

CROSS-REFERENCE TO RELATED APPLICATIONS

This application is a U.S. National Phase Entry of PCT International Application No. PCT/CN2021/091627, filed on Apr. 30, 2021. The disclosure of PCT International Application No. PCT/CN2021/091627 is incorporated by reference herein in its entirety.

TECHNICAL FIELD

Embodiments of the present disclosure relate to a display substrate and a display device.

BACKGROUND

With the development of display electronic products such as mobile phones, the increase in a screen-to-body ratio of the display screen has become a product trend, and functional components, such as a front camera, necessary for the mobile phone have become a major factor restricting the increase in the screen-to-body ratio. To solve this problem, the industry has proposed a solution, referred to as the "under-screen camera," in which the camera and the display substrate are combined into a display device. In such a solution, the display device includes a display substrate and a camera located below the display substrate. A region, where the under-screen camera is located, of the display device can emit light and display like other regions, and further has a camera function at the same time.

SUMMARY

At least some embodiments of the present disclosure provide a display substrate, and the display substrate comprises a first display region and a first region at least partially surrounding the first display region. The first display region comprises a plurality of first light-emitting elements, the first region comprises a plurality of first pixel circuits and at least one first capacitance compensation structure, and the display substrate comprises a plurality of transparent wiring lines extending from the first region to the first display region; at least one first pixel circuit of the plurality of first pixel circuits is electrically connected to at least one first light-emitting element of the plurality of first light-emitting elements through at least one transparent wiring line of the plurality of transparent wiring lines, and the at least one first pixel circuit is configured to control a driving current, for driving the at least one first light-emitting element to emit light, flowing through the at least one first pixel circuit, the at least one transparent wiring line, and the at least one first light-emitting element; and the at least one first capacitance compensation structure is coupled to at least one transparent wiring line of the plurality of transparent wiring lines, and is configured to compensate for a parasitic capacitance caused by the at least one transparent wiring line coupled to the at least one first capacitance compensation structure.

For example, in the display substrate provided by some embodiments of the present disclosure, a compensation capacitance provided by the at least one first capacitance compensation structure is connected in parallel with the parasitic capacitance caused by the at least one transparent wiring line coupled to the at least one first capacitance compensation structure.

For example, in the display substrate provided by some embodiments of the present disclosure, a sum of a value of the parasitic capacitance of the at least one transparent wiring line coupled to the at least one first capacitance compensation structure and a value of the compensation capacitance of the at least one first capacitance compensation structure is approximately equal to a target capacitance value.

For example, in the display substrate provided by some embodiments of the present disclosure, the target capacitance value is greater than or equal to a maximum value among parasitic capacitance values of the plurality of transparent wiring lines.

For example, in the display substrate provided by some embodiments of the present disclosure, a parasitic capacitance value of one or more transparent wiring lines comprised in the plurality of transparent wiring lines is approximately equal to the target capacitance value, and the one or more transparent wiring lines are not coupled to the at least one first capacitance compensation structure.

For example, in the display substrate provided by some embodiments of the present disclosure, the plurality of transparent wiring lines are divided into a plurality of transparent wiring line groups, and each transparent wiring line group in the plurality of transparent wiring line groups comprises at least one transparent wiring line; an average value of a parasitic capacitance value of the at least one transparent wiring line in the each transparent wiring line group serves as an average parasitic capacitance value of the each transparent wiring line group; and the target capacitance value is greater than or equal to a maximum value among average parasitic capacitance values of the plurality of transparent wiring line groups.

For example, in the display substrate provided by some embodiments of the present disclosure, an average parasitic capacitance value of at least one transparent wiring line group in the plurality of transparent wiring line groups is approximately equal to the target capacitance value, and at least one transparent wiring line in the at least one transparent wiring line group is not coupled to the at least one first capacitance compensation structure.

For example, in the display substrate provided by some embodiments of the present disclosure, the first region comprises a peripheral region, the peripheral region is between the first display region and at least one side edge of the display substrate, and the plurality of first pixel circuits and a plurality of first capacitance compensation structures are in the peripheral region.

For example, in the display substrate provided by some embodiments of the present disclosure, the first region comprises a second display region, the second display region at least partially surrounds the first display region, and the second display region comprises a second pixel unit; the second pixel unit comprises a second light-emitting element and a second pixel circuit; the second pixel circuit is electrically connected to the second light-emitting element, and is configured to control a driving current, for driving the second light-emitting element to emit light, flowing through the second pixel circuit and the second light-emitting element; and the plurality of first pixel circuits and a plurality of first capacitance compensation structures are in the second display region.

For example, in the display substrate provided by some embodiments of the present disclosure, the first region comprises a second display region and a peripheral region, the second display region at least partially surrounds the first display region, and the peripheral region is between the first display region and at least one side edge of the display substrate; the second display region comprises a second pixel unit, the second pixel unit comprises a second light-emitting element and a second pixel circuit, and the second pixel circuit is electrically connected to the second light-emitting element and is configured to control a driving current, for driving the second light-emitting element to emit light, flowing through the second pixel circuit and the second light-emitting element; and a part of the plurality of first pixel circuits and apart of a plurality of first capacitance compensation structures are in the peripheral region, and another part of the plurality of first pixel circuits and another part of the plurality of first capacitance compensation structures are in the second display region.

For example, in the display substrate provided by some embodiments of the present disclosure, the second display region further comprises a second capacitance compensation structure, the second capacitance compensation structure is coupled to the second pixel circuit and the second light-emitting element, and is configured to provide a compensation capacitance to the second pixel circuit, and a compensation capacitance value of the second capacitance compensation structure is approximately equal to a target capacitance value.

For example, in the display substrate provided by some embodiments of the present disclosure, in a plane of the display substrate, the at least one first capacitance compensation structure is on a side of a first pixel circuit corresponding to the at least one first capacitance compensation structure away from the first display region.

For example, in the display substrate provided by some embodiments of the present disclosure, the display substrate comprises a base substrate, a pixel circuit layer, a transparent wiring line layer, and a light-emitting element layer, and the pixel circuit layer, the transparent wiring line layer, and the light-emitting element layer are sequentially arranged on the base substrate; the pixel circuit layer comprises a gate electrode layer and a source-drain electrode layer; each first light-emitting element in the plurality of first light-emitting elements is in the light-emitting element layer; each first pixel circuit in the plurality of first pixel circuits comprises a thin film transistor, the thin film transistor comprises a gate electrode, a source electrode, and a drain electrode, the gate electrode is in the gate electrode layer, and at least one of the source electrode and the drain electrode is in the source-drain electrode layer; each transparent wiring line in the plurality of transparent wiring lines is in the transparent wiring line layer; and the at least one first capacitance compensation structure comprises a first capacitance electrode and a second capacitance electrode, and one of the first capacitance electrode and the second capacitance electrode is in the gate electrode layer, the source-drain electrode layer, or the transparent wiring line layer.

For example, in the display substrate provided by some embodiments of the present disclosure, the source electrode or the drain electrode is electrically connected to one of the first capacitance electrode and the second capacitance electrode, and the source electrode or the drain electrode is further electrically connected to the first light-emitting element through the transparent wiring line.

For example, in the display substrate provided by some embodiments of the present disclosure, the pixel circuit layer further comprises a capacitance electrode plate layer, and another of the first capacitance electrode and the second capacitance electrode is in the capacitance electrode plate layer.

For example, in the display substrate provided by some embodiments of the present disclosure, the at least one first capacitance compensation structure comprises a plurality of capacitance compensation structures, and first capacitance electrodes or second capacitance electrodes of the plurality of capacitance compensation structures are an integral structure.

For example, in the display substrate provided by some embodiments of the present disclosure, the display substrate comprises a first panel surface and a second panel surface, and the first panel surface is used for display during operation of the display substrate; and the first display region is a transparent display region, and is configured to allow light incident from a side of the first panel surface to transmit to a side of the second panel surface.

At least some embodiments of the present disclosure further provide a display device, and the display device comprises the display substrate provided by any one of the embodiments of the present disclosure.

For example, the display device provided by some embodiments of the present disclosure further comprises a sensor. The display substrate comprises a first panel surface and a second panel surface, and the first panel surface is used for display during operation; the first display region is a transparent display region, and is configured to allow light incident from a side of the first panel surface to transmit to a side of the second panel surface; and the sensor is provided on the side of the second panel surface of the display substrate, an orthographic projection of the sensor on the display substrate at least partially overlaps with the first display region, and the sensor is configured to receive the light incident from the side of the first panel surface.

For example, in the display device provided by some embodiments of the present disclosure, the sensor comprises at least one of a group consisting of an image sensor, an infrared sensor, and a distance sensor.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

In the design solution of "under-screen camera", a portion of the display region for installing sensors (such as an image sensor, an infrared sensor, a distance sensor) and other components may be designed as a transparent display region. In this way, the transparent display region can provide convenience for installing sensors and other components while achieving the display function, so that these sensors can perform functions such as imaging, infrared sensing, distance sensing, or the like through the transparent display region without substantially affecting the display function of the transparent display region, thereby contributing to the implementation of an electronic device with a full screen.

Figure 1A:
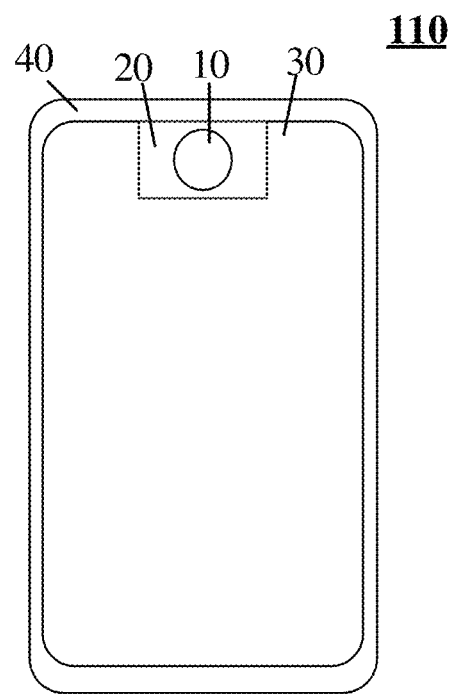
FIG. 1A is a schematic planar diagram of a display substrate.

FIG. 1A is a schematic planar diagram of a display substrate. For example, as illustrated in FIG. 1A, the display substrate 110 includes a display region and a peripheral region 40 surrounding the display region. The display region includes a transparent display region 10, a transition display region 20, and a main display region 30. For example, the transparent display region 10 allows light to be transmitted from one side of the display substrate 110 to the other side of the display substrate 110.

Figure 1B:
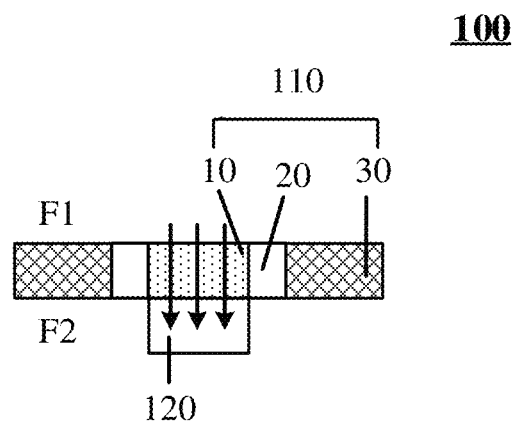
FIG. 1B is a schematic cross-sectional diagram of a partial structure of a display device.

FIG. 1B is a schematic cross-sectional diagram of a partial structure of a display device. For example, as illustrated in FIG. 1B, the display device 100 includes the display substrate 110 illustrated in FIG. 1A and a sensor 120. The display substrate 110 has a first panel surface F1 and a second panel surface F2, and the first panel surface is used for display (i.e., facing a user) during the operation of the display substrate 110. The sensor 120 is arranged on a side of the second panel surface F2 (that is, a side of the display substrate 110 away from the user, that is, a non-display side of the display substrate 110), and an orthographic projection of the sensor 120 on the display substrate at least partially overlaps with the transparent display region 10. The sensor 120 is configured to receive light incident from the side of the first panel surface F1 (i.e., a display side of the display substrate 110).

Figure 1C:
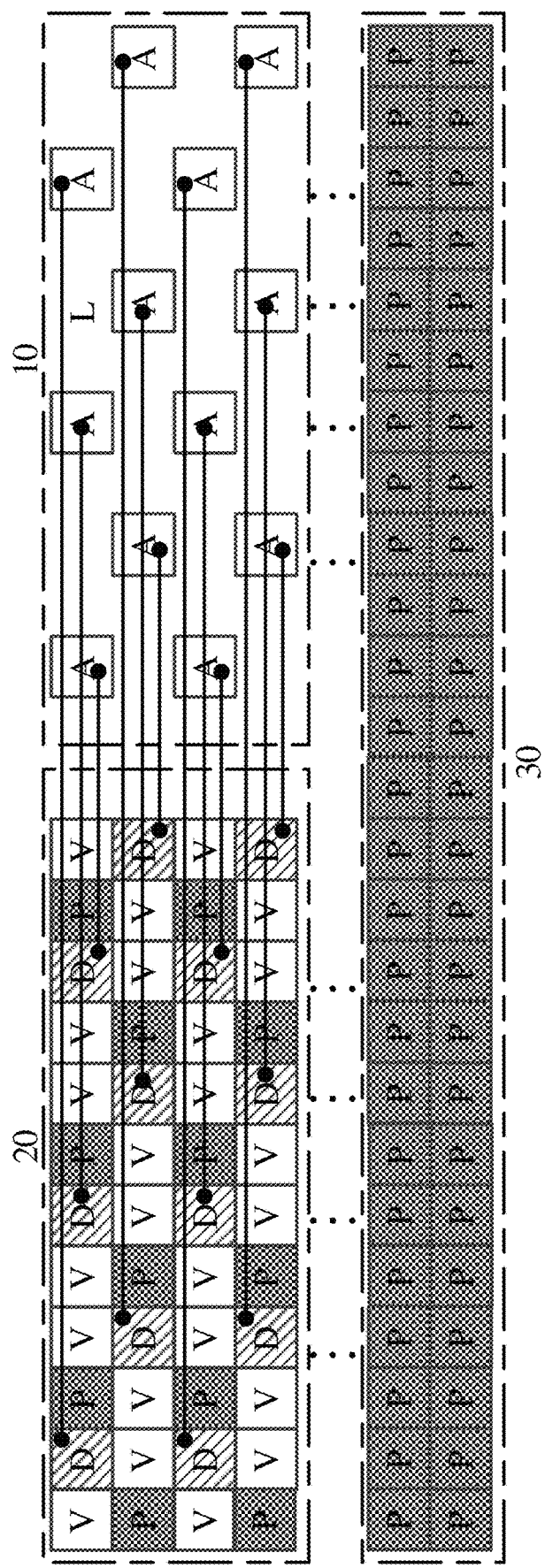
FIG. 1C is a partial enlarged schematic diagram of the display substrate illustrated in FIG. 1A.

FIG. 1C is a partial enlarged schematic diagram of the display substrate illustrated in FIG. 1A. For example, as illustrated in FIG. 1C, the main display region 30 is a primary display region (or referred to as a conventional display region). Compared with the transparent display region 10 and the transition display region 20, the main display region 30 may have a higher resolution (pixel per inch, PPI), that is, pixels (one pixel may include a plurality of sub-pixels) for display are arranged with a relatively high density in the main display region 30. For example, in the main display region 30, each sub-pixel (as indicated by a block P in the main display region 30) includes a light-emitting element and a pixel circuit for driving the light-emitting element.

For example, as illustrated in FIG. 1C, pixels (one pixel may include a plurality of sub-pixels) for display are arranged with a relatively low density in the transparent display region 10 and/or the transition display region 20. For example, the transparent display region 10 and the transition display region 20 have the same resolution.

For example, compared with the main display region 30, pixels (one pixel may include a plurality of sub-pixels) for display are arranged with the same density in the transparent display region 10 and/or the transition display region 20, and an area of the pixel driving circuit in the transparent display region 10 and/or the transition display region 20 is smaller than an area of the pixel driving circuit in the main display region 30.

The transparent display region 10 may allow the light incident from the display side of the display substrate 110 to pass through the display substrate 110 to reach the non-display side of the display substrate 110, so as to be used for the normal operation of components such as the sensor 120 located on the non-display side of the display substrate 110. Of course, the transparent display region 10 may also allow the light emitted from the non-display side 120 of the display substrate 110 to pass through the display substrate 110 to reach the display side of the display substrate 110. However, because the pixel circuit of the sub-pixel is generally opaque to light, in order to improve the transparency of the transparent display region 10, the light-emitting element of the sub-pixel in the transparent display region 10 may be physically separated from the pixel circuit for driving the light-emitting element of the sub-pixel in the transparent display region 10.

For example, as illustrated in FIG. 1C, the sub-pixel (as illustrated by a block A in the transparent display region 10) in the transparent display region 10 may only retain the light-emitting element, and the pixel circuit of the sub-pixel in the transparent display region 10 may be arranged in the transition display region 20, as indicated by a block D in the transition display region 20, thus occupying part of the space of the transition display region 20, while part or all of the remaining space of the transition display region 20 is used to arrange the sub-pixels of the transition display region 20 (as indicated by a block P in the transition display region 20). The sub-pixel in the transition display region includes a light-emitting element and a pixel circuit for driving the light-emitting element. For example, as illustrated in FIG. 1C, the transition display region 20 may include a vacant region (as indicated by a block V in the transition display region 20), and in the vacant region, no light-emitting elements or pixel circuits are usually provided.

For example, as illustrated in FIG. 1C, the light-emitting element of the sub-pixel in the transparent display region 10 is electrically connected to the corresponding pixel circuit in the transition display region 20 through the wiring line L (illustrated by a black line segment in FIG. 1C). In order to improve the transparency of the transparent display region 10, the above-mentioned wiring line L is usually a transparent wiring line, or at least the part of the wiring line L located in the transparent display region 10 is transparent (in this case, even if the rest part of the wiring line L is not transparent, the wiring line L can be considered as a transparent wiring line in the present disclosure). For example, the transparent wiring line may be made of a transparent conductive material, such as a transparent metal oxide, such as indium tin oxide (ITO), indium gallium zinc oxide (IGZO), etc., so as to have good transparency. It should be noted that, in the present disclosure, "transparent" and "transparency" only need to have a certain light transmittance, for example, the light transmittance is greater than 0, and the light transmittance is not required to be 100%. For example, generally, if the light transmittance of any structure or region is greater than a certain value (for example, 40%, 45%, 50%, etc.), the structure or region can be considered to be "transparent" or "transparency."

It should be noted that, in FIG. 1C, the block P may represent one sub-pixel, the block A may represent one light-emitting element, the block D may represent one pixel circuit, and the wiring line L may represent one transparent wiring line connecting one light-emitting element A and one pixel circuit D. Alternatively, in FIG. 1C, the block P may represent one pixel (i.e., one sub-pixel group, including a plurality of sub-pixels), the block A may represent one group of light-emitting elements (including a plurality of light-emitting elements in one pixel), the block D may represent one group of pixel circuits (including a plurality of pixel circuits corresponding to the plurality of light-emitting elements in one pixel), and the wiring line L may represent one group of transparent wiring lines (including a plurality of transparent wiring lines) connecting one group of light-emitting elements A and one group of pixel circuits D.

Figure 2A:
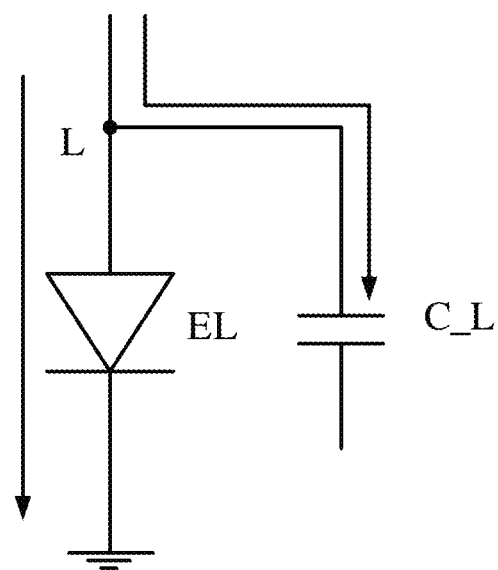
FIG. 2A is a schematic diagram of an equivalent circuit in which a transparent wiring line is coupled to a first light-emitting element.

FIG. 2A is a schematic diagram of an equivalent circuit in which a transparent wiring line L is coupled to a first light-emitting element LE. For example, referring to FIG. 1C and FIG. 2A, one end of the transparent wiring line L is coupled to the pixel circuit (not shown in FIG. 2A), and the other end of the transparent wiring line L is coupled to the light-emitting element EL (e.g., coupled to the anode of the light-emitting element EL). Referring to FIG. 1C and FIG. 2A, there is a coupling effect of the transparent wiring line L with components, wiring lines, other electrical structures, and the like which are disposed near the transparent wiring line L. Therefore, there is usually a parasitic capacitance C_L on the transparent wiring line L. For different transparent wiring lines L (usually it may be considered that different transparent wiring lines L have the same width and the same thickness), lengths of the different transparent wiring lines L are not the same, pixel regions spanned by the different transparent wiring lines L (there are usually various components, wiring lines, other electrical structures, and the like in the pixel region) are also different. Therefore, the magnitudes of the parasitic capacitances C_L on the different transparent wiring lines L are also different. Generally, the longer the length of the transparent wiring line L and the more pixel regions the transparent wiring line L spans, the larger the parasitic capacitance C_L of the transparent wiring line L.

Figure 2B:
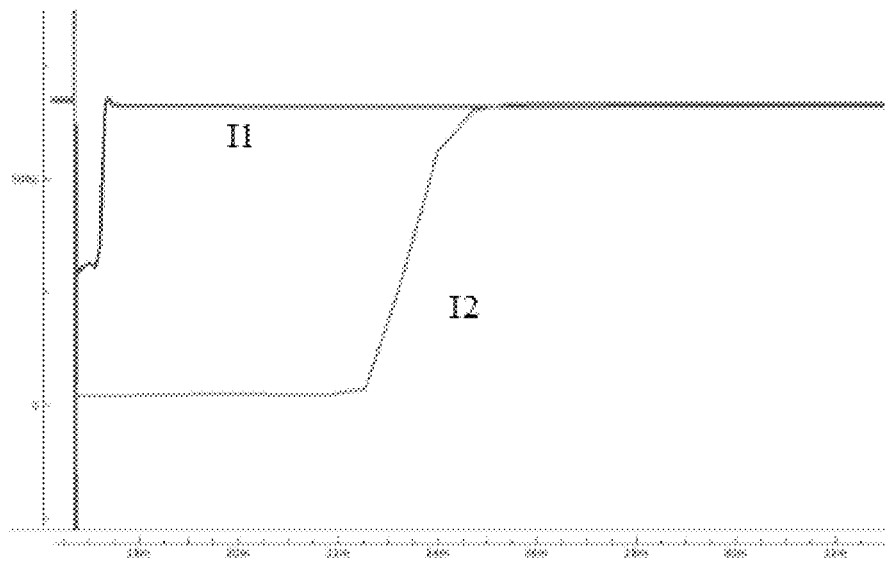
FIG. 2B is a schematic diagram showing a change of a driving current flowing through the first light-emitting element illustrated in FIG. 2A.

FIG. 2B is a schematic diagram showing a change of a driving current flowing through the first light-emitting element LE illustrated in FIG. 2A. Referring to FIG. 2A and FIG. 2B, when the first pixel circuit provides the driving current, a part of the driving current is first used to charge the parasitic capacitance C_L of the transparent wiring line L, the remaining part of the driving current will flow through the first light-emitting element LE (referring to the straight arrow in FIG. 2A), and the driving current will not fully act on the first light-emitting element LE until the voltage of the parasitic capacitance C_L reaches electrical equilibrium (that is, the voltage no longer changes). Therefore, the driving current actually flowing through the first light-emitting element LE will go through a process from small to large until stable (referring to the curve I1 or curve I2 in FIG. 2B). The larger the parasitic capacitance C_L is, the longer it takes for the driving current actually flowing through the first light-emitting element LE to reach a stable state.

Considering the two first light-emitting elements LE1 and LE2, the parasitic capacitances of the transparent wiring lines L corresponding to the two first light-emitting elements LE1 and LE2 are C_L1 and C_L2 (assuming C_L1 and C_L2), while at the same time, ignoring the difference between the two first light-emitting elements LE1 and LE2 and the difference between the first pixel circuits corresponding to the two first light-emitting elements LE1 and LE2, in the case of displaying the same gray scale (that is, the magnitudes of the driving currents provided by the first pixel circuits corresponding to the two first light-emitting elements LE1 and LE2 are basically the same), changes of the driving currents actually flowing through the two first light-emitting elements LE1 and LE2 are illustrated as the curve I1 and the curve I2 in FIG. 2B, respectively, that is, the first light-emitting element LE1 does not emit light according to the stable value of the driving current (that is, the driving current provided by the first pixel circuit) for a relatively short period of time, however, the first light-emitting element LE2 does not emit light according to the stable value of the driving current for a relatively long period of time. Therefore, with respect to the expected luminous brightness corresponding to the displayed gray scale, the luminous brightness of the two first light-emitting elements LE1 and LE2 are both reduced. Moreover, the reduction amount of the luminous brightness of the first light-emitting element LE2 is greater than the reduction amount of the luminous brightness of the first light-emitting element LE1, that is, the brightness of the two first light-emitting elements LE1 and LE2 is uneven, and this phenomenon is more obvious at low gray scales.

At least some embodiments of the present disclosure provide a display substrate, and the display substrate includes a first display region and a first region at least partially surrounding the first display region; the first display region includes a plurality of first light-emitting elements, the first region includes a plurality of first pixel circuits and at least one first capacitance compensation structure, and the display substrate includes a plurality of transparent wiring lines extending from the first region to the first display region; at least one first pixel circuit of the plurality of first pixel circuits is electrically connected to at least one first light-emitting element of the plurality of first light-emitting elements through at least one transparent wiring line of the plurality of transparent wiring lines, and the at least one first pixel circuit is configured to control a driving current, for driving the at least one first light-emitting element to emit light, flowing through the at least one first pixel circuit, the at least one transparent wiring line, and the at least one first light-emitting element; and the at least one first capacitance compensation structure is coupled to at least one transparent wiring line of the plurality of transparent wiring lines, and is configured to compensate for a parasitic capacitance caused by the at least one transparent wiring line coupled to the at least one first capacitance compensation structure.

Some embodiments of the present disclosure further provide a display device corresponding to the above-mentioned display substrate.

In the display substrate provided by the embodiments of the present disclosure, the parasitic capacitance of the transparent wiring line may be compensated by the first capacitance compensation structure, so that the luminous brightness of different first light-emitting elements may have better uniformity, so as to alleviate or solve the problem of uneven brightness in the first display region (especially the problem of uneven brightness when the first display region displays a low gray scale), thereby ameliorating the display effect of the first display region.

Several embodiments of the present disclosure will be described in detail below with reference to the accompanying drawings. It should be noted that, in order to keep the description of the embodiments of the present disclosure clear and concise, detailed descriptions of known functions and known components (elements) may be omitted. When any component (element) of the embodiments of the present disclosure appears in more than one drawing, the component (element) is denoted by the same or similar reference numeral in each drawing.

Figure 3A:
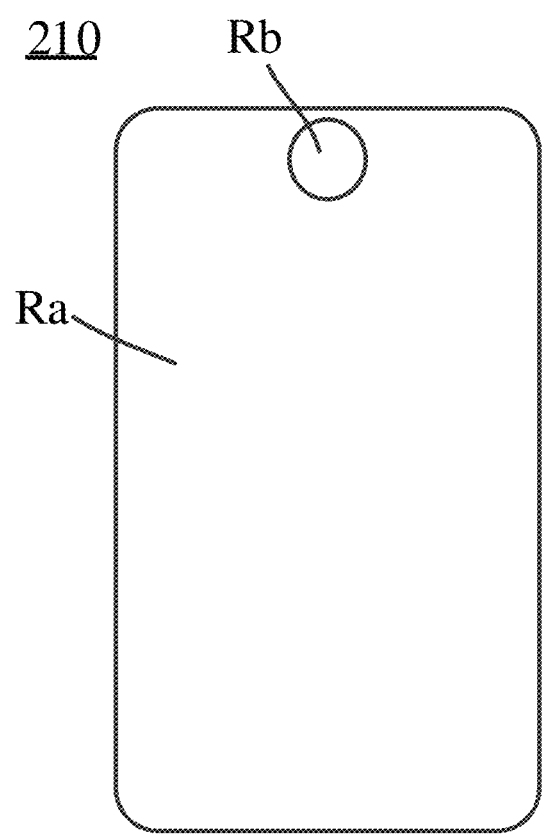
FIG. 3A is a schematic planar diagram of a display substrate provided by some embodiments of the present disclosure.
Figure 3B:
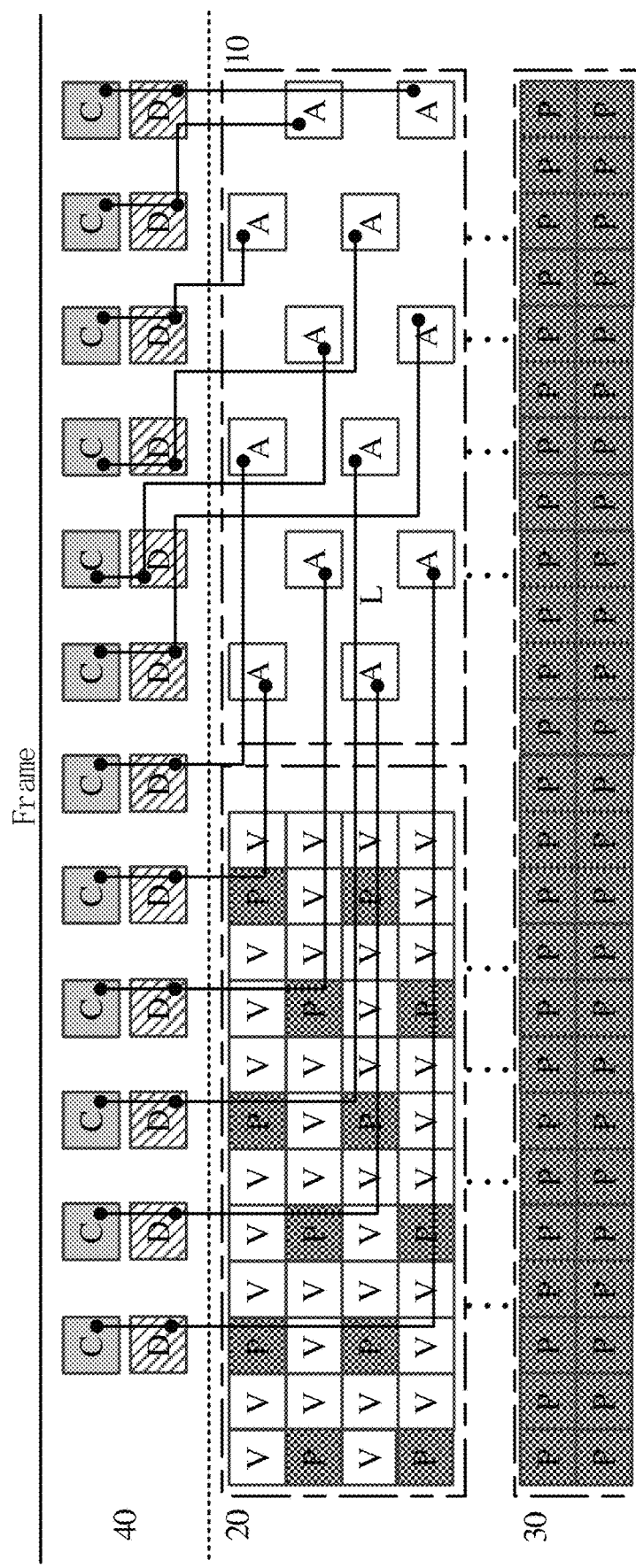
FIG. 3B is a partial enlarged schematic diagram of a display substrate provided by some embodiments of the present disclosure.
Figure 3C:
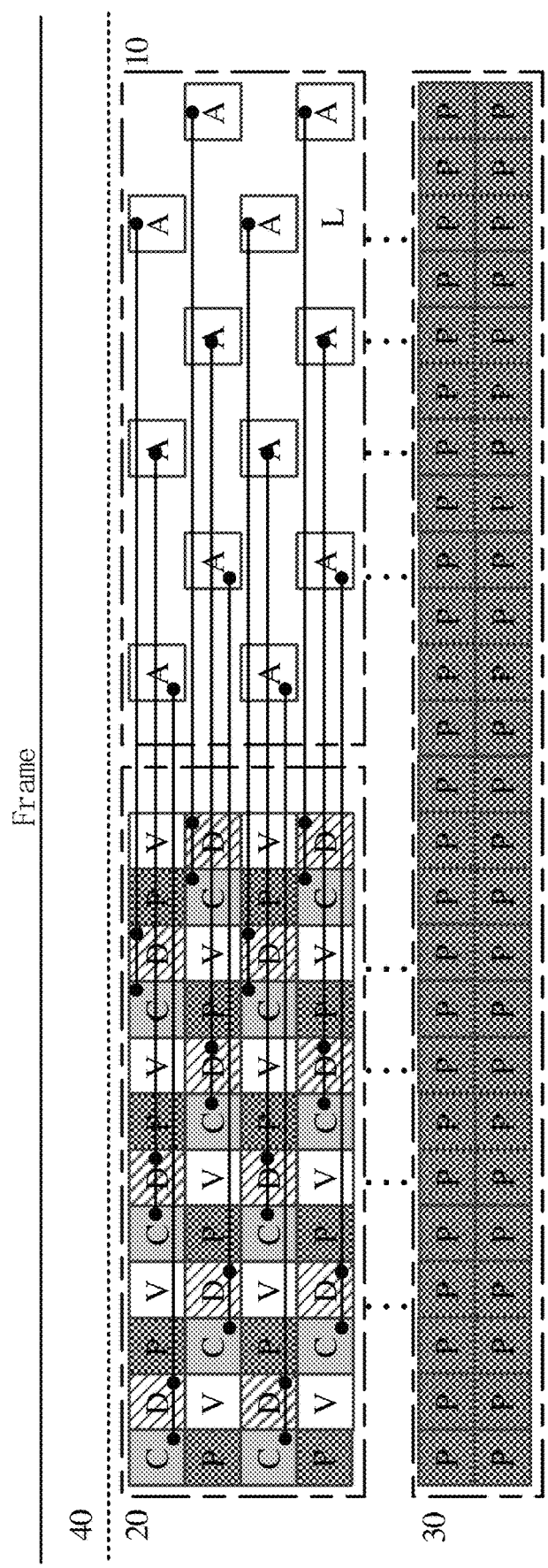
FIG. 3C is a partial enlarged schematic diagram of another display substrate provided by some embodiments of the present disclosure.

FIG. 3A is a schematic planar diagram of a display substrate provided by some embodiments of the present disclosure, FIG. 3B is a partial enlarged schematic diagram of a display substrate provided by some embodiments of the present disclosure, and FIG. 3C is a partial enlarged schematic diagram of another display substrate provided by some embodiments of the present disclosure.

For example, as illustrated in FIG. 3A, the display substrate 210 includes a first display region Rb and a first region Ra at least partially surrounding the first display region Rb. For example, referring to FIG. 1A, similar to the display substrate 110 illustrated in FIG. 1A, the display substrate 210 may also include a display region (referring to the display region of the display substrate 110) and a peripheral region 40 (referring to the peripheral region 40 of the display substrate 110) surrounding the display region, and the display region may include a first display region 10 (referring to the transparent display region 10 of the display substrate 110), a second display region 20 (referring to the transition display region 20 of the display substrate 110), and a third display region 30 (referring to the transition display region 20 of the display substrate 110). In this case, the first display region Rb is the first display region 10, and the first region Ra includes the second display region 20, the third display region 30, and the peripheral region 40.

For example, in some embodiments, as illustrated in FIG. 1A and FIG. 3A to FIG. 3C, the first display region Rb (i.e., the first display region 10) includes a plurality of first light-emitting elements A, the first region Ra includes a plurality of first pixel circuits D and at least one first capacitance compensation structure C, and the display substrate 210 includes a plurality of transparent wiring lines L extending from the first region Ra to the first display region Rb. Each first pixel circuit D is electrically connected to a corresponding first light-emitting element A through a corresponding transparent wiring line L, and each first pixel circuit D is configured to control a driving current, for driving the corresponding first light-emitting element A to emit light, flowing through the first pixel circuit D, the corresponding transparent wiring line L, and the corresponding first light-emitting element A. The at least one first capacitance compensation structure C is coupled to at least one transparent wiring line among the plurality of transparent wiring lines L, and is configured to compensate for the parasitic capacitance caused by the at least one transparent wiring line.

Figure 4:
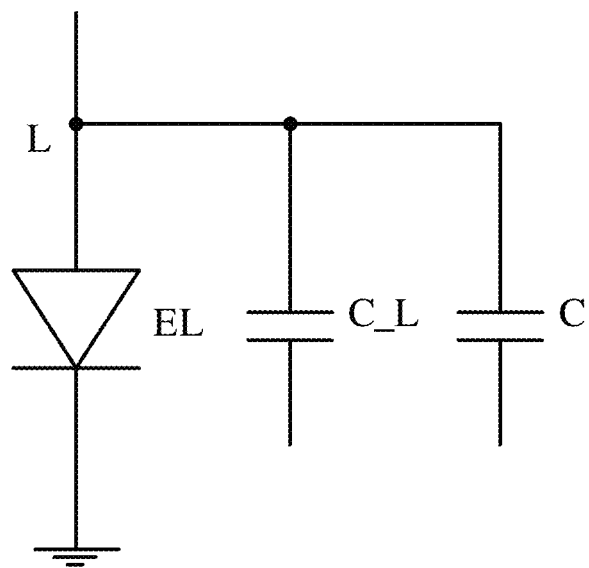
FIG. 4 is a schematic diagram of an equivalent circuit in which a transparent wiring line is coupled to a first capacitance compensation structure and a first light-emitting element provided by some embodiments of the present disclosure.

FIG. 4 is a schematic diagram of an equivalent circuit in which a transparent wiring line L is coupled to a first capacitance compensation structure C and a first light-emitting element EL (that is, the first light-emitting element A) provided by some embodiments of the present disclosure. Referring to FIG. 3B, FIG. 3C and FIG. 4, one end of the transparent wiring line L (as illustrated by a line segment or a polygonal line segment connecting the first pixel circuit D and the first light-emitting element A in FIG. 3B and FIG. 3C) is coupled to the first pixel circuit D (not shown in FIG. 4) and the first capacitance compensation structure C, and the other end of the transparent wiring line L is coupled to the light-emitting element EL (e.g., coupled to the anode of the light-emitting element EL). For example, as illustrated in FIG. 4, the compensation capacitance C provided by the first capacitance compensation structure C is connected in parallel with the parasitic capacitance $C\_L$ caused by the transparent wiring line L, and therefore, the compensation capacitance C of the first capacitance compensation structure C can be used to compensate for the parasitic capacitance $C\_L$ caused by the transparent wiring line L. For example, in some embodiments, a sum of the value of the parasitic capacitance $C\_L$ of the transparent wiring line L and the value of the compensation capacitance of the first capacitance compensation structure C may be approximately equal to the same target capacitance value. Therefore, referring to the above-mentioned description of FIG. 2B, it can be known that in this way, the change curve of the driving current flowing through each of the first light-emitting elements LE can be adjusted to be substantially consistent. That is to say, by providing the first capacitance compensation structure C, the light-emitting brightness of the first light-emitting elements LE in the first display region 10 can be basically consistent when displaying the same gray scale, so that the problem of uneven brightness in the first display region can be alleviated or solved, and the display effect of the first display region can be ameliorated.

It should be noted that, in the present disclosure, "a is approximately equal to b" means that the value of a is within x % of the value of b. For example, the value range of x may be 3-10, and the embodiments of the present disclosure include but are not limited to this. For example, x may be equal to 3, 5, 7, 10, or the like, and the embodiments of the present disclosure include but are not limited thereto.

For example, in some embodiments, the above-mentioned target capacitance value may be greater than or equal to the maximum value among the parasitic capacitance values $C\_L$ of respective transparent wiring lines L. For example, in some embodiments, the target capacitance value may be equal to the maximum value among the parasitic capacitance values $C\_L$ of respective transparent wiring lines L, and in this case, the transparent wiring line L, the parasitic capacitance value of which is approximately equal to the target capacitance value, does not need to be compensated, that is, the transparent wiring line L with the parasitic capacitance value being approximately equal to the target capacitance value may not be coupled with the first capacitance compensation structure C. Thus, the number of the first capacitance compensation structures C can be reduced, and the space of the display substrate can be saved.

For example, in some embodiments, as illustrated in FIG. 3A and FIG. 3B, the first region Ra may include a peripheral region 40, and the peripheral region 40 is located between the first display region 10 and at least one side edge (as illustrated by the "frame" in FIG. 3B) of the display substrate. For example, as illustrated in FIG. 3B, the first pixel circuit D and the first capacitance compensation structure C in the display substrate 210 may all be located in the peripheral region 40, and each first capacitance compensation structure C is coupled to the corresponding first pixel circuit D. For example, as illustrated in FIG. 3B, the first capacitance compensation structure C, the first pixel circuit D, and the transparent wiring line L, which correspond to each other, are coupled to the same node (as illustrated by an end point, located in the block D, of the line segment connecting the first capacitance compensation structure C and the first pixel circuit D in FIG. 3B, and the end point coincides with one end point of the transparent wiring line L).

For example, in some embodiments, in the display substrate illustrated in FIG. 3B, the first region Ra may further include the second display region 20 and the third display region 30. As illustrated in FIG. 3B, the second display region includes a second pixel unit P, and the second pixel unit P may include a second light-emitting element (not shown in FIG. 3B) and a second pixel circuit (not shown in FIG. 3B). For example, the second pixel circuit is electrically connected to the second light-emitting element (the transparent wiring line L is not included in the connection path), and is configured to control a driving current that flows through the second pixel circuit and the second light-emitting element and drives the second light-emitting element to emit light. Likewise, the third display region 30 also includes the second pixel unit P. For example, as illustrated in FIG. 3B, the second display region 20 may further comprise a vacant region (as indicated by the block V in the second display region 20 in FIG. 3B), and in the vacant region, no light-emitting elements or pixel circuits are usually provided. For example, the resolution of the second display region 20 may generally be greater than or equal to the resolution of the first display region 10, and the resolution of the third display region 30 may generally be greater than or equal to the resolution of the second display region 20/first display region 10, and the embodiments of the present disclosure include but are not limited thereto.

For example, in some embodiments, in the display substrate illustrated in FIG. 3B, at least part of the transparent wiring lines L may extend and pass through the second display region 20.

It should be understood that, compared with the display substrate illustrated in FIG. 1C, in the display substrate illustrated in FIG. 3B, the first pixel circuit D does not need to be provided in the second display region 20, and therefore, the second pixel units P in the second display region 20 may have the same dense arrangement structure as that of the second pixel units P in the third display region 30. That is to say, in some embodiments, the second pixel units may be arranged in the vacant region V in the second display region 20 of the display substrate illustrated in FIG. 3B, so that the second display region 20 has the same pixel unit arrangement structure as the third display region 30, that is, the resolution of the second display region 20 is the same as the resolution of the third display region 30.

For example, in some embodiments, in conjunction with FIG. 3A and FIG. 3C, the first region Ra may include the second display region 20, and the second display region 20 at least partially surrounds the first display region 10. For example, as illustrated in FIG. 3C, the second display region 20 includes the second pixel unit P, and the second pixel unit P may include the second light-emitting element (not shown in FIG. 3C) and the second pixel circuit (not shown in FIG. 3C). For example, the second pixel circuit is electrically connected to the second light-emitting element (the connection path does not include a transparent wiring line), and is configured to control the driving current that flows through the second pixel circuit and the second light-emitting element and drives the second light-emitting element to emit light. For example, as illustrated in FIG. 3C, the first pixel circuit D and the first capacitance compensation structure C in the display substrate 210 may all be located in the second display region 40, and each of the first capacitance compensation structures C is coupled to the corresponding first pixel circuit D. For example, as illustrated in FIG. 3C, the first capacitance compensation structure C, the first pixel circuit D, and the transparent wiring line L, which correspond to each other, are coupled to the same node (as illustrated by an end point, located in the block D, of the line segment connecting the first capacitance compensation structure C and the first pixel circuit D in FIG. 3C, and the end point coincides with one end point of the transparent wiring line L). For example, as illustrated in FIG. 3C, the second display region 20 may further include a vacant region (as indicated by the block V in the second display region 20 in FIG. 3C), and in the vacant region, no light-emitting elements or pixel circuits are usually provided.

For example, in some embodiments, as illustrated in FIG. 3A to FIG. 3C, a part of the first pixel circuits D and a part of the first capacitance compensation structures C may be located in the peripheral region 40, and another part of the first pixel circuits D and another part of the first capacitance compensation structures C are located in the second display region 20. In this situation, the layout and other details of the first pixel circuit D and the first capacitance compensation structure C located in the peripheral region 40 may be referred to the relevant description of the embodiment illustrated in FIG. 3B, the layout and other details of the first pixel circuit D and the first capacitance compensation structure C located in the second display region 20 may be referred to the related description of the embodiment illustrated in FIG. 3C, and details will not be repeated here. Therefore, in one aspect, it is possible to avoid the problem that the parasitic capacitance of part of the transparent wiring lines is too large due to too many first pixel circuits D and first capacitance compensation structures C being provided in the peripheral region 40, and in another aspect, it can also avoid the problem that the peripheral region 40 occupies an excessively large area of the display substrate, which leads to the problem that the area of the display region is reduced.

For example, in some embodiments, in order to simplify the design and layout of the first capacitance compensation structure C, the transparent wiring lines L may be grouped for compensation. For example, the plurality of transparent wiring lines are divided into a plurality of transparent wiring line groups, and each transparent wiring line group includes at least one transparent wiring line. For example, in the case where the transparent wiring line group includes a plurality of transparent wiring lines, the values of the parasitic capacitances of the plurality of transparent wiring lines are approximately equal. For example, an average value of parasitic capacitance values of the transparent wiring lines in each transparent wiring line group is taken as an average parasitic capacitance value of each transparent wiring line group. For example, in the case where the transparent wiring line group includes one transparent wiring line, the value of the parasitic capacitance of the one transparent wiring line (which is regarded as the average value of the parasitic capacitance value) is used as the average parasitic capacitance value of the transparent wiring line group. In the case where the transparent wiring line group includes a plurality of transparent wiring lines, the average value of the parasitic capacitance values of the plurality of transparent wiring lines is used as the average parasitic capacitance value of the transparent wiring line group. For example, the target capacitance value is greater than or equal to a maximum value among average parasitic capacitance values of the respective transparent wiring line groups.

For example, in some embodiments, the first light-emitting element corresponding to the transparent wiring line in each transparent wiring line group may be regarded as one pixel group, the pixel circuit corresponding to the transparent wiring line in each transparent wiring line group is regarded as one pixel circuit group, and the first capacitance compensation structure corresponding to the transparent wiring line in each transparent wiring line group is regarded as one compensation structure group. For example, in some embodiments, the target capacitance value is equal to the maximum value among the average parasitic capacitance values of the transparent wiring line groups, and in this case, the transparent wiring line in the transparent wiring line group with the average parasitic capacitance value being approximately equal to the target capacitance value does not need to be compensated, that is, the transparent wiring line group with the average parasitic capacitance value being approximately equal to the target capacitance value does not need to be provided with a corresponding compensation structure group. That is, the transparent wiring line, the parasitic capacitance value of which is approximately equal to the target capacitance value, may not be coupled to the first capacitance compensation structure C. Therefore, the number of the compensation structure groups can be reduced, that is, the number of the first capacitance compensation structures C can be reduced, thereby saving the space of the display substrate.

It should be understood that, corresponding to the above-mentioned grouping compensation solution, the block A, the block D, and the block C in FIG. 3B and FIG. 3C can be regarded as one pixel group (including the first light-emitting element), one pixel circuit group, and one compensation structure group, respectively. Similarly, the block P in FIG. 3B and FIG. 3C may also be regarded as one pixel group (including the second light-emitting element and the second pixel circuit).

Figure 5A:
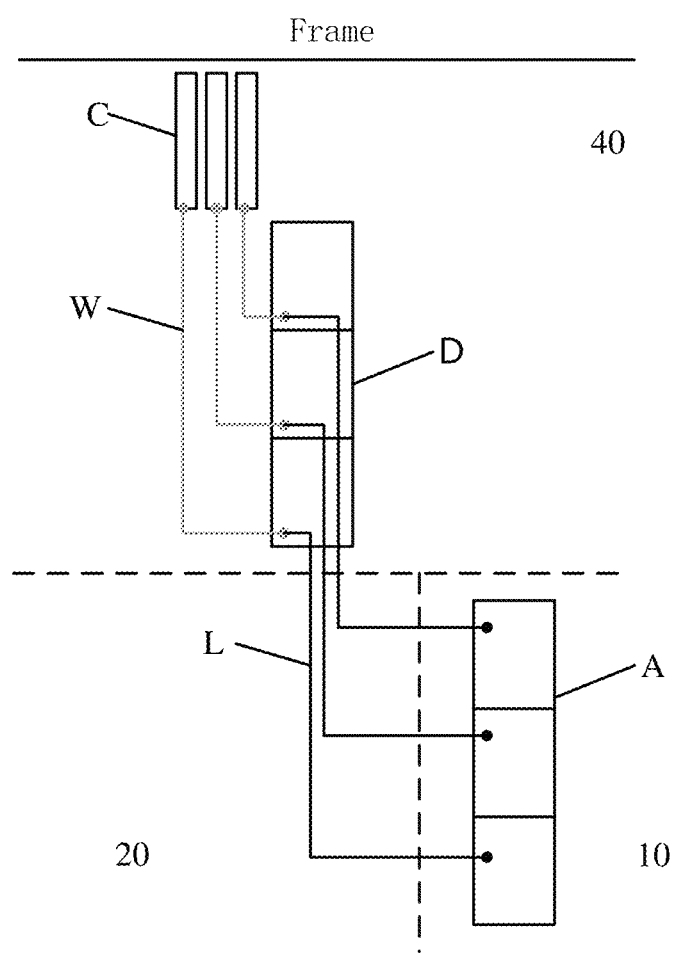
FIG. 5A is a schematic planar diagram showing coupling between a pixel group, a transparent wiring line group, a pixel circuit group, and a compensation structure group provided by some embodiments of the present disclosure.

FIG. 5A is a schematic planar diagram showing coupling between a pixel group, a transparent wiring line group, a pixel circuit group, and a compensation structure group provided by some embodiments of the present disclosure. FIG. 5A shows a situation in which the pixel circuit group D and the compensation structure group C are located in the peripheral region 40. Schematically, FIG. 5A shows the case where the pixel group A includes three first light-emitting elements, the transparent wiring line group L includes three transparent wiring lines, the pixel circuit group includes three first pixel circuits, and the compensation structure group C includes three first capacitance compensation structures. As illustrated in FIG. 5A, the first light-emitting element in each pixel group A is electrically connected to the first pixel circuit in the corresponding pixel circuit group through the transparent wiring line in the corresponding transparent wiring line group L, and the first pixel circuit in the pixel circuit group is also coupled with the first capacitance compensation structure in the corresponding compensation structure group. For example, as illustrated in FIG. 5A, the transparent wiring line and the first capacitance compensation structure are coupled to the same node (as illustrated by the gray circle dot in the pixel circuit group D in FIG. 5A).

Figure 5B:
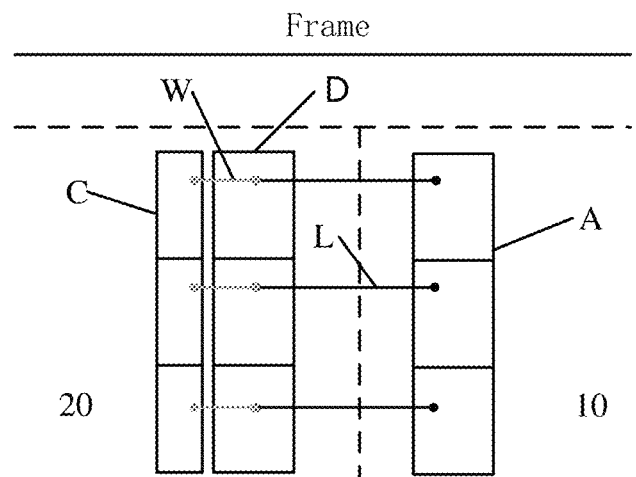
FIG. 5B is another schematic planar diagram showing coupling between a pixel group, a transparent wiring line group, a pixel circuit group, and a compensation structure group provided by some embodiments of the present disclosure.

FIG. 5B is another schematic planar diagram showing coupling between a pixel group, a transparent wiring line group, a pixel circuit group, and a compensation structure group provided by some embodiments of the present disclosure. FIG. 5B shows a situation in which the pixel circuit group D and the compensation structure group C are located in the second display region 20. Schematically, FIG. 5B shows the case where the pixel group A includes three first light-emitting elements, the transparent wiring line group L includes three transparent wiring lines, the pixel circuit group includes three first pixel circuits, and the compensation structure group C includes three first capacitance compensation structures. As illustrated in FIG. 5B, the first light-emitting element in each pixel group A is electrically connected to the first pixel circuit in the corresponding pixel circuit group through the transparent wiring line in the corresponding transparent wiring line group L, and the first pixel circuit in the pixel circuit group is also coupled with the first capacitance compensation structure in the corresponding compensation structure group. For example, as illustrated in FIG. 5B, the transparent wiring line and the first capacitance compensation structure are coupled to the same node (as illustrated by the gray circle dot in the pixel circuit group D in FIG. 5B).

It should be noted that, in practical applications, as illustrated in FIG. 3B and FIG. 3C, the first light-emitting elements, the first pixel circuits, the first capacitance compensation structures, and the second pixel units are usually arranged in an array in the display region where they are located. In addition, the layouts of the transparent wiring lines L in FIG. 3B and FIG. 3C are both schematic, and are not limited by the embodiments of the present disclosure. In practical applications, on the basis of convenient production, the transparent wiring lines can be reasonably laid out according to actual needs, so as to minimize the difference in the values of the parasitic capacitances of the respective transparent wiring lines, thereby reducing the compensation capacitance value of the first capacitance compensation structure and further reducing the space occupied by the first capacitance compensation structure.

It should also be noted that the embodiments of the present disclosure do not limit the specific structures of the first light-emitting element, the first pixel circuit, the first capacitance compensation structure, and the second pixel unit. For example, in order to simplify design and facilitate manufacturing, the specific structure of the first light-emitting element may be the same as the specific structure of the second light-emitting element in the second pixel unit, the specific structure of the first pixel circuit may be the same as the specific structure of the second pixel circuit in the second pixel unit, and the embodiments of the present disclosure include but are not limited thereto.

For example, in order to achieve that the PPI of the second display region 20 is consistent with the PPI of the first display region 10, the area of the projection of the first light-emitting element on the base substrate is smaller than the area of the projection of the second light-emitting element in the second pixel unit on the base substrate, the area of the projection of the first pixel circuit on the base substrate is smaller than the area of the projection of the second pixel circuit in the second pixel unit on the base substrate, and the embodiments of the present disclosure include but are not limited to this. For example, in some embodiments, as illustrated in FIG. 3B, FIG. 3C, FIG. 5A, and FIG. 5B, in the plane where the display substrate is located, the first capacitance compensation structure can be disposed on a side of the corresponding first pixel circuit away from the first display region 10, so as to facilitate the layout of the transparent wiring line.

For example, in some embodiments, in order to allow the brightness of the second display region 20 and the brightness of the first display region 10 to be uniform, capacitance compensation may be performed on the second pixel unit P in the second display region 20. For example, the second display region 20 may further include a second capacitance compensation structure, and the second capacitance compensation structure is coupled to the second pixel circuit and the second light-emitting element in the second pixel unit P and is configured to provide a compensation capacitance to the second pixel circuit. For example, the compensation capacitance value of the second capacitance compensation structure is approximately equal to the target capacitance value. Therefore, referring to the related description of FIG. 2B, it can be known that in this way, the change curve of the driving current flowing through the second light-emitting element can be adjusted to be substantially consistent with the change curve of the driving current flowing through the first light-emitting element, so that the brightness of the second display region 20 and the brightness of the first display region 10 can be uniform, and the overall display effect of the first display region 10 and the second display region 20 can be improved.

It should be noted that, in practical applications, the value of the parasitic capacitance of the transparent wiring line and the compensation capacitance value of the first capacitance compensation structure may be determined by technical methods such as simulation and/or experimental measurement.

Figure 6A:
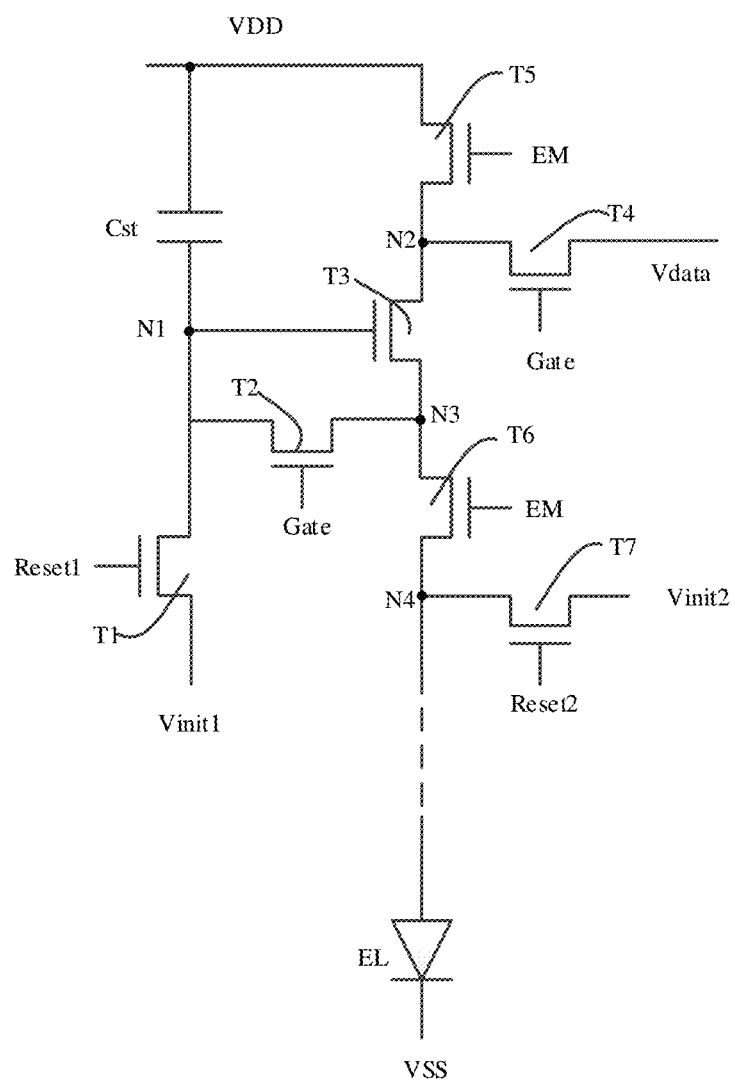
FIG. 6A is a schematic diagram of a circuit structure of a pixel driving circuit provided by some embodiments of the present disclosure.

For example, in some embodiments, the first pixel circuit and the second pixel circuit may adopt common pixel driving circuits, such as 2T1C (two transistors and one capacitor), 4T1C (four transistors and one capacitor), 4T2C (four transistors and two capacitors), 7T1C (seven transistors and one capacitor), or the like, but are not limited thereto. The present disclosure does not limit the specific structures of the first pixel circuit and the second pixel circuit. For example, FIG. 6A shows a 7T1C pixel driving circuit. As illustrated in FIG. 6A, the 7T1C pixel driving circuit includes first to seventh transistors T1-T7 and a storage capacitor Cst.

For example, as illustrated in FIG. 6A, a gate electrode of the first transistor T1 is connected to a first reset signal terminal (or a first reset signal line) to receive a first reset signal Reset1, a first electrode of the first transistor T1 is connected to a first reset voltage terminal (or a first reset voltage line) to receive a first reset voltage Vinit1, and a second electrode of the first transistor T1 is connected to a first node N1; a gate electrode of the second transistor T2 is connected to a scanning signal terminal (or a scanning signal line) to receive a scanning signal Gate, a first electrode of the second transistor T2 is connected to the first node N1, and a second electrode of the second transistor T2 is connected to a third node N3; a gate electrode of the third transistor T3 is connected to the first node N1, a first electrode of the third transistor T3 is connected to the third node N3, and a second electrode of the third transistor T3 is connected to a second node N2; a gate electrode of the fourth transistor T4 is connected to the scanning signal terminal (or the scanning signal line) to receive the scanning signal Gate, a first electrode of the fourth transistor T4 is connected to the second node N2, and a second electrode of the fourth transistor T4 is connected to a data signal terminal (or a data signal line) to receive a data signal Vdata; a gate electrode of the fifth transistor T5 is connected to a light-emitting control signal terminal (or a light-emitting control signal line) to receive a light-emitting control signal EM, a first electrode of the fifth transistor T5 is connected to the second node N2, and a second electrode of the fifth transistor T5 is connected to a first power supply terminal (or a first power supply line) to receive a first power supply voltage VDD (e.g., a high voltage); a gate electrode of the sixth transistor T6 is connected to the light-emitting control signal terminal (or the light-emitting control signal line) to receive the light-emitting control signal EM, a first electrode of the sixth transistor T6 is connected to a fourth node N4, and a second electrode of the sixth transistor T6 is connected to the third node N3; a gate electrode of the seventh transistor T7 is connected to a second reset signal terminal (or a second reset signal line) to receive a second reset signal Reset2, a first electrode of the seventh transistor T7 is connected to a second reset voltage terminal (or a second reset voltage line) to receive a second reset voltage Vinit2, and a second electrode of the seventh transistor T7 is connected to the fourth node N4; and a first electrode of the storage capacitor Cst is coupled to the first node N1, and a second electrode of the storage capacitor Cst is coupled to the first power supply terminal (or the first power supply line) to receive the first power supply voltage VDD.

For example, for the first pixel circuit, the anode of the first light-emitting element EL is electrically connected to the fourth node N4 through the transparent wiring line, the cathode of the first light-emitting element EL is connected to a second power supply terminal (or a second power supply line) to receive a second power supply voltage VSS (e.g., a low voltage), and the first capacitance compensation structure (not shown in FIG. 6A) is coupled to the fourth node N4. For example, for the second pixel circuit, the anode of the second light-emitting element EL is directly coupled to the fourth node N4, and the cathode of the second light-emitting element EL is connected to the second power supply terminal (or the second power supply line) to receive the second power supply voltage VSS (e.g., a low voltage). For example, for the second pixel circuit in the second display region 20, in the case of providing the second capacitance compensation structure, the second capacitance compensation structure (not shown in FIG. 6A) is coupled to the fourth node N4.

It is should be noted that, transistors used in the embodiments of the present disclosure may be thin film transistors, field effect transistors, or other switching devices with the same characteristics. A source electrode and a drain electrode of the transistor used herein may be symmetrical in structure, so the source electrode and the drain electrode of the transistor may have no difference in structure. In the embodiment illustrated in FIG. 6A, in order to distinguish the two electrodes of the transistor except the gate electrode, one of the two electrodes is directly described as the first electrode, and the other of the two electrodes is described as the second electrode.

In addition, the transistors may be classified into N-type transistors and P-type transistors according to the characteristics of the transistors. When the transistor is a P-type transistor, the turn-on voltage is a low-level voltage (e.g., 0V, −5V, −10V, or other suitable voltages), and the turn-off voltage is a high-level voltage (e.g., 5V, 10V, or other suitable voltages); and when the transistor is an N-type transistor, the turn-on voltage is a high-level voltage (e.g., 5V, 10V, or other suitable voltages), and the turn-off voltage is a low-level voltage (e.g., 0V, −5V, −10V, or other suitable voltages). For example, in the pixel driving circuit illustrated in FIG. 6A, the first to seventh transistors T1-T7 are all P-type transistors, such as low temperature polysilicon thin film transistors. However, the embodiments of the present disclosure do not limit the type of the transistor. When the type of the transistor is changed, the connection relationship in the circuit and the polarity of the signal may be adjusted accordingly.

Figure 6B:
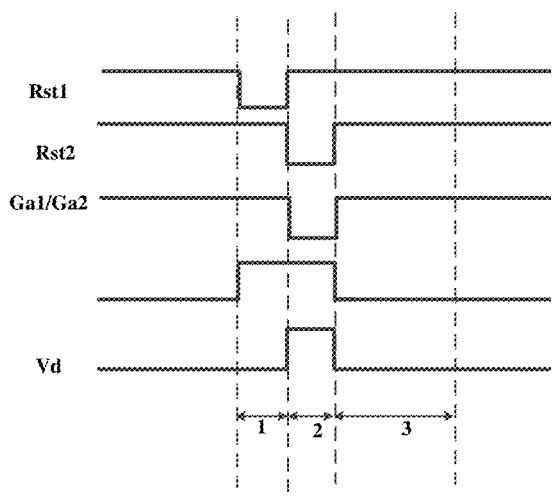
FIG. 6B is a signal timing diagram of a driving method of a pixel driving circuit provided by some embodiments of the present disclosure.

The operation principle of the pixel driving circuit illustrated in FIG. 6A will be described below with reference to the signal timing diagram illustrated in FIG. 6B. As illustrated in FIG. 6B, a display process of each frame of image includes three phases, which are an initialization phase 1, a data writing and compensation phase 2, and a light-emitting phase 3, respectively.

In the initialization phase 1, the first reset control signal Reset1 is input to turn on the first transistor T1, and the first reset voltage Vinit1 is applied to the gate electrode of the first transistor T1, thereby resetting the first node N1.

In the data writing and compensation phase 2, the scanning signal Gate and the data signal Vdata are input, the second transistor T2 and the fourth transistor T4 are turned on, and the data signal Vdata is written into the second node N2 through the fourth transistor T4, and charges the first node N1 through the third transistor T3 and the second transistor T2, until the potential of the first node N1 changes to Vdata+Vth, and in this case, the third transistor T3 is turned off, where Vth is the threshold voltage of the third transistor T3. The potential of the first node N1 is stored in the storage capacitor Cst to be maintained, that is to say, the voltage information with the data signal Vdata and the threshold voltage Vth is stored in the storage capacitor Cst for providing gray scale display data and compensating for the threshold voltage of the third transistor T3 itself in the subsequent light-emitting phase.

In the data writing and compensation phase 2, the second reset control signal Reset2 may also be input to turn on the seventh transistor T7, and the second reset voltage Vinit2 is applied to the fourth node N4, thereby resetting the fourth node N4. For example, the reset of the fourth node N4 may also be performed in the initialization phase 1, and for example, the first reset control signal Reset1 and the second reset control signal Reset2 may be the same. The embodiments of the present disclosure are not limited in this aspect.

In the light-emitting phase 3, the light-emitting control signal EM is input to turn on the fifth transistor T5, the sixth transistor T6, and the third transistor T3, and the sixth transistor T6 applies a driving current to the light-emitting element EL to allow the light-emitting element EL to emit light. The value of the driving current Id provided by the pixel driving circuit can be obtained according to the following formula:

$$Id=K(VGS-Vth)^2=K[(Vdata+Vth-VDD)-Vth]^2=K(Vdata-VDD)^2$$

where K is a constant.

In the above formula, Vth represents the threshold voltage of the first transistor T1, VGS represents the voltage between the gate electrode and source electrode (here is the first electrode) of the third transistor T3, and K is a constant value related to the third transistor T3 itself. It can be seen from the above calculation formula of Id that the driving current Id provided by the pixel driving circuit is no longer related to the threshold voltage Vth of the third transistor T3, so that compensation for the pixel driving circuit can be achieved, thereby solving the problem of threshold voltage drift of the driving transistor (the third transistor T3 in the embodiment of the present disclosure) caused by the process and long-term operation, and eliminating its influence on the driving current Id, so as to improve the display effect of the display device using the same.

Figure 7A:
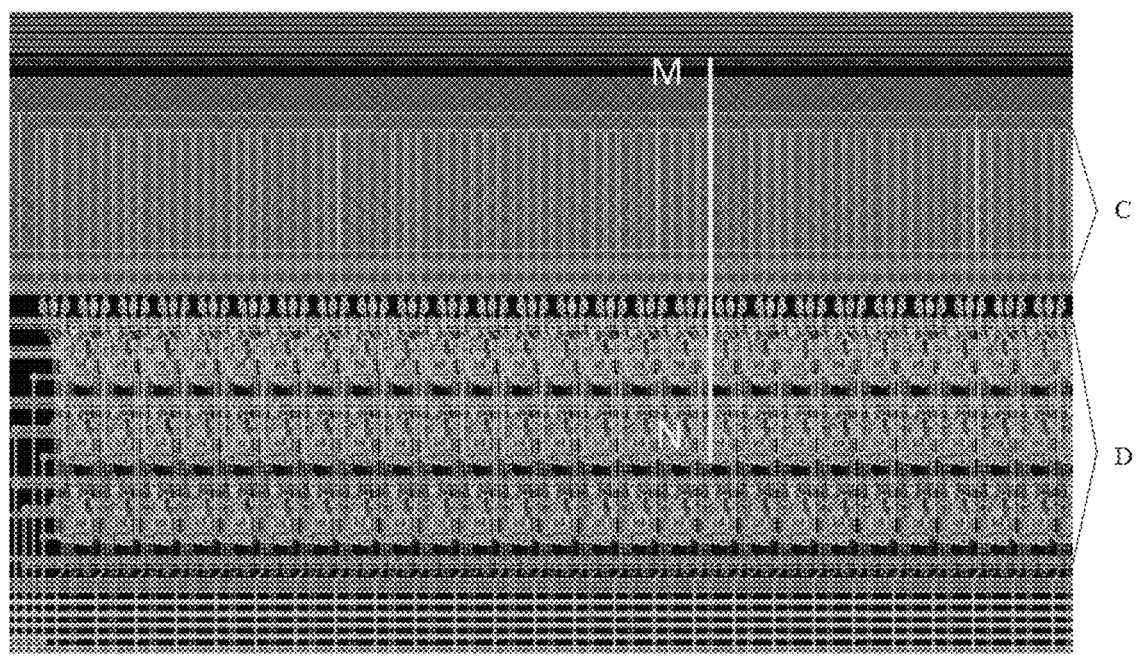
FIG. 7A is a partial region layout of an overall structure of a display substrate provided by some embodiments of the present disclosure.
Figure 7B:
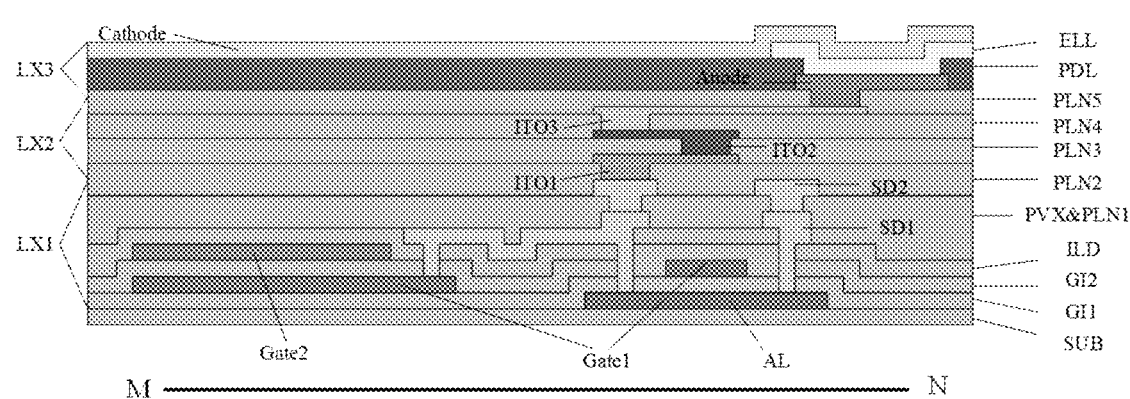
FIG. 7B is a schematic cross-sectional diagram of the display substrate illustrated in FIG. 7A along a line M-N.

FIG. 7A is a partial region layout of an overall structure of a display substrate provided by some embodiments of the present disclosure. FIG. 7A exemplarily shows the layout of the first pixel circuit D and the first capacitance compensation structure. FIG. 7B is a schematic cross-sectional diagram of the display substrate illustrated in FIG. 7A along a line M-N. For example, as illustrated in FIG. 7B, the display substrate includes a base substrate SUB, and a pixel circuit layer LX1, a transparent wiring line layer LX2, and a light-emitting element layer LX3 that are sequentially arranged on the base substrate SUB.

For example, as illustrated in FIG. 7B, the pixel circuit layer LX1 includes an active layer AL, a gate electrode layer Gate1, and a source-drain electrode layer SD (e.g., including a first source-drain electrode layer SD1 and a second source-drain electrode layer SD2). For example, the active layer AL may include a semiconductor material, and the gate electrode layer Gate1, the first source-drain electrode layer SD1, and the second source-drain electrode layer SD2 may include a metal material or an alloy material. For example, the first pixel circuit includes a thin film transistor, the thin film transistor includes a gate electrode, a source electrode, and a drain electrode, the gate electrode is located in the gate electrode layer Gate1, and at least one of the source electrode and the drain electrode is located in the source-drain electrode layer SD. It should be noted that FIG. 7B only schematically shows one thin film transistor in the first pixel circuit. For example, the thin film transistor may be the sixth transistor in the 7T1C pixel driving circuit illustrated in FIG. 6A, and the embodiments of the present disclosure include but are not limited to this.

For example, as illustrated in FIG. 7B, the transparent wiring line layer LX2 includes a first transparent wiring line layer ITO1, a second transparent wiring line layer ITO2, and a third transparent wiring line layer ITO3. For example, each transparent wiring line is located in the transparent wiring line layer LX2. For example, each transparent wiring line includes a portion located in the first transparent wiring line layer ITO1, a portion located in the second transparent wiring line layer ITO2, and a portion located in the third transparent wiring line layer ITO3, and the embodiments of the present disclosure include but are not limited thereto. For example, the first transparent wiring line layer ITO1, the second transparent wiring line layer ITO2, and the third transparent wiring line layer ITO3 may include a transparent conductive material, such as the transparent metal oxide such as indium tin oxide (ITO), indium gallium zinc oxide (IGZO), etc., to have good light transmittance.

For example, as illustrated in FIG. 7B, the light-emitting element layer LX3 includes an anode layer Anode, a light-emitting layer ELL, and a cathode layer Cathode. For example, the first light-emitting element includes an anode located in the anode layer Anode, a light-emitting material located in the light-emitting layer ELL, and a cathode located in the cathode layer Cathode. For example, the display substrate illustrated in FIG. 7B may be an organic light-emitting diode (OLED) display substrate or a quantum dot light-emitting diode (QLED) display substrate, etc., and the embodiments of the present disclosure do not limit the specific type of the display substrate. For example, in the case that the display substrate is an organic light-emitting diode display substrate, the light-emitting layer ELL may include a small molecular organic material or a polymer molecular organic material, may be a fluorescent light-emitting material or a phosphorescent light-emitting material, and may emit red light, green light, and blue light, or may emit white light, etc. Moreover, according to actual needs, the light-emitting layer ELL may further include one or more functional layers, such as an electron injection layer, an electron transport layer, a hole injection layer, a hole transport layer, or the like. For example, in the case that the display substrate is a quantum dot light-emitting diode (QLED) display substrate, the light-emitting layer ELL may include a quantum dot material, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc. For example, as illustrated in FIG. 7B, the source electrode or drain electrode of the thin film transistor is electrically connected to the first light-emitting element (e.g., to the anode of the first light-emitting element) through the transparent wiring line.

For example, the first capacitance compensation structure includes a first capacitance electrode and a second capacitance electrode. For example, the compensation capacitance value of the first capacitance compensation structure is usually positively proportional to the size of the overlapping area of the first capacitance electrode and the second capacitance electrode, and is inversely proportional to the distance between the first capacitance electrode and the second capacitance electrode (the distance in the direction perpendicular to the display substrate). For example, as illustrated in FIG. 7B, the pixel circuit layer LX1 may further include a capacitance electrode plate layer Gate2. For example, as illustrated in FIG. 7B, one of the first capacitance electrode and the second capacitance electrode is located in the gate electrode layer Gate1, and the other one of the first capacitance electrode and the second capacitance electrode is located in the capacitance electrode plate layer Gate2. For example, as illustrated in FIG. 7B, the source electrode or drain electrode of the thin film transistor is electrically connected to one of the first capacitance electrode and the second capacitance electrode. For example, the other one of the first capacitance electrode and the second capacitance electrode may be electrically connected to a DC signal, for example, may be electrically connected to the aforementioned first power supply line VDD or second power supply line VSS. For example, in some embodiments, the first capacitance electrodes or the second capacitance electrodes of the plurality of capacitance compensation structures may be an integral structure, so that the manufacturing process can be simplified.

It should be noted that, the setting manner of the first capacitance compensation structure illustrated in FIG. 7B is schematic, and the embodiments of the present disclosure do not limit this. For example, in some embodiments, one of the first capacitance electrode and the second capacitance electrode may be located in one layer of the gate electrode layer Gate1, the source-drain electrode layer SD, the transparent wiring line layer LX2, the capacitance electrode plate layer Gate2, etc., and the other of the first capacitance electrode and the second capacitance electrode may be located in any one of the above-mentioned layers except for the one layer, as long as the first capacitance compensation structure formed therefrom can meet the requirements of capacitance compensation. Of course, in the case that the first capacitance electrode and the second capacitance electrode are respectively located in two layers of the gate electrode layer Gate1, the source-drain electrode layer SD, and the transparent wiring line layer LX2, the capacitance electrode plate layer Gate2 can be omitted from the display substrate.

It should be noted that, a plurality of elements, components, structures, and/or parts located in the same layer or disposed in the same layer may generally be composed of the same material and may be formed by the same patterning process. Specifically, the same film forming process can be used to form a film layer for forming a specific pattern, and then a layer structure is formed by patterning the film layer through one patterning process using the same mask.

Depending on the specific pattern, one patterning process may include a plurality of exposure, development, or etching processes, and the specific pattern in the formed layer structure may be continuous or discontinuous.

By arranging a certain capacitance electrode in the first capacitance compensation structure and a certain layer of the display substrate to be in the same layer, the process can be simplified and the cost can be reduced. Of course, in some embodiments, a conductive layer may also be specially provided on the display substrate to form a certain capacitance electrode in the first capacitance compensation structure.

For example, as illustrated in FIG. 7B, according to actual needs, the display substrate may further include a first gate insulating layer GI1, a second gate insulating layer GI2, an interlayer definition layer ILD, a passivation layer PVX (for example, may also serve as a planarization layer PLN1), planarization layers PLN2 to PLN5, a pixel definition layer PDL, and other functional layers. For example, these functional layers may include inorganic insulating materials, such as silicon oxide, silicon nitride, silicon oxynitride, etc., or may include organic insulating materials, such as polyimide, polyphthalimide, polyphthalamide, acrylic resin, benzocyclobutene, phenolic resin, or the like. It should be noted that the embodiments of the present disclosure do not specifically limit the materials of the aforementioned various functional layers.

For example, in some embodiments, the setting manner of the second pixel circuit may refer to the setting manner of the first pixel circuit, the setting manner of the second light-emitting element may refer to the setting manner of the first light-emitting element, and the embodiments of the present disclosure are not limited in this aspect. For example, in some embodiments, when the display substrate includes the second capacitance compensation structure, the setting manner of the second capacitance compensation structure may refer to the setting manner of the first capacitance compensation structure, and the embodiments of the present disclosure are also not limited in this aspect.

It should be understood that the structure of each layer of the display substrate illustrated in FIG. 7B is schematic. In practical applications, based on the display substrate illustrated in FIG. 7B, some of the illustrated functional layers can be reduced as required, as long as the display function of the display substrate and the capacitance compensation function of the first capacitance compensation structure are not affected. Of course, some unshown functional layers (e.g., a buffer layer, an encapsulation layer, etc.) may also be added as required. The embodiments of the present disclosure are not limited in this aspect.

Figure 7C:
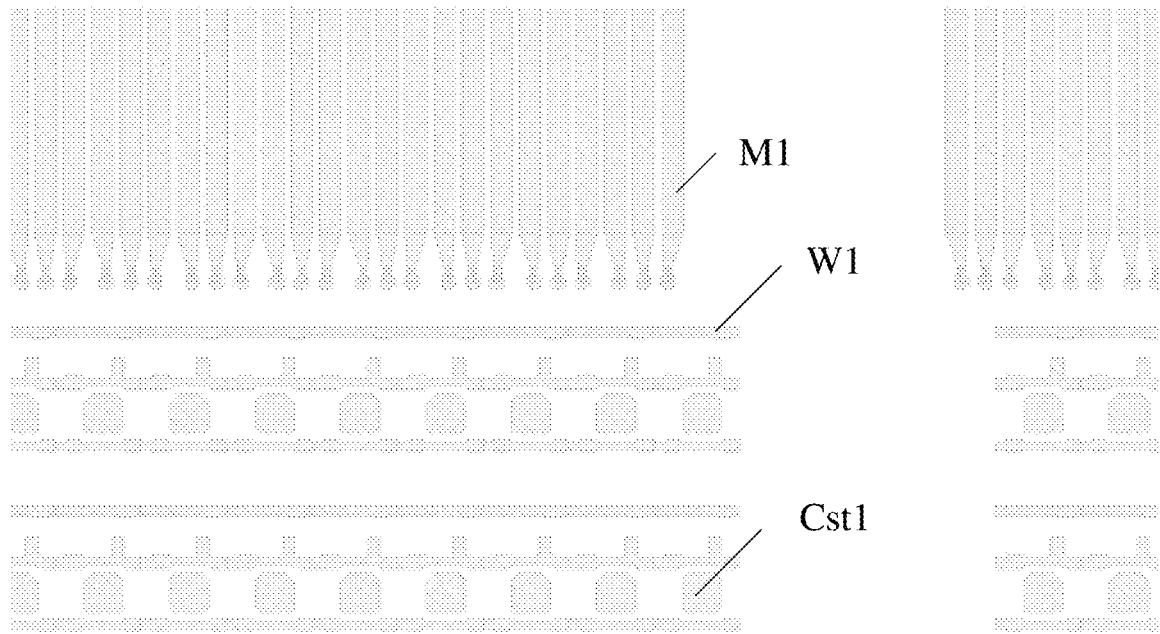
FIG. 7C is a schematic planar diagram of a first conductive layer in the display substrate illustrated in FIG. 7A.

FIG. 7C is a schematic planar diagram of a first conductive layer (that is, the aforementioned gate electrode layer Gate1) in the display substrate illustrated in FIG. 7A. For example, in some embodiments, as illustrated in FIG. 7C, the capacitance electrode plate M1 of the first capacitance compensation structure, the gate electrode of the aforementioned thin film transistor, one capacitance electrode plate Cst1 of the aforementioned storage capacitor Cst, the gate line W1 (including the reset signal line, the scanning signal line, the light-emitting control signal line), and the like may all be located in the first conductive layer. It should be noted that the present disclosure includes but is not limited to this. For example, as illustrated in FIG. 7C, the capacitance electrode plates M1 of the respective first capacitance compensation structures are provided separately.

Figure 7D:
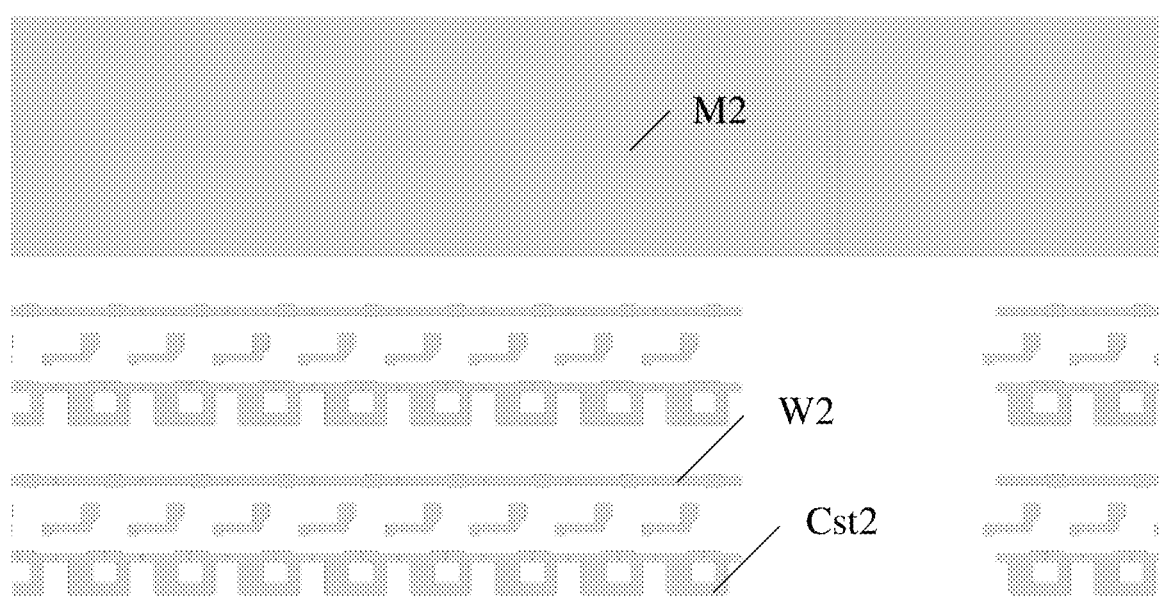
FIG. 7D is a schematic planar diagram of a second conductive layer in the display substrate illustrated in FIG. 7A.

FIG. 7D is a schematic planar diagram of a second conductive layer (that is, the aforementioned capacitance electrode plate layer Gate2) in the display substrate illustrated in FIG. 7A. For example, in some embodiments, as illustrated in FIG. 7D, the capacitance electrode plate M2 of the first capacitance compensation structure, the other capacitance electrode plate Cst2 of the aforementioned storage capacitor Cst, the reset voltage line W2, etc. may all be located in the second conductive layer. It should be noted that the present disclosure includes but is not limited to this. For example, as illustrated in FIG. 7D, the capacitance electrode plates M2 of the respective first capacitance compensation structures may be integrally provided, and the embodiments of the present disclosure include but are not limited to this.

Figure 7E:
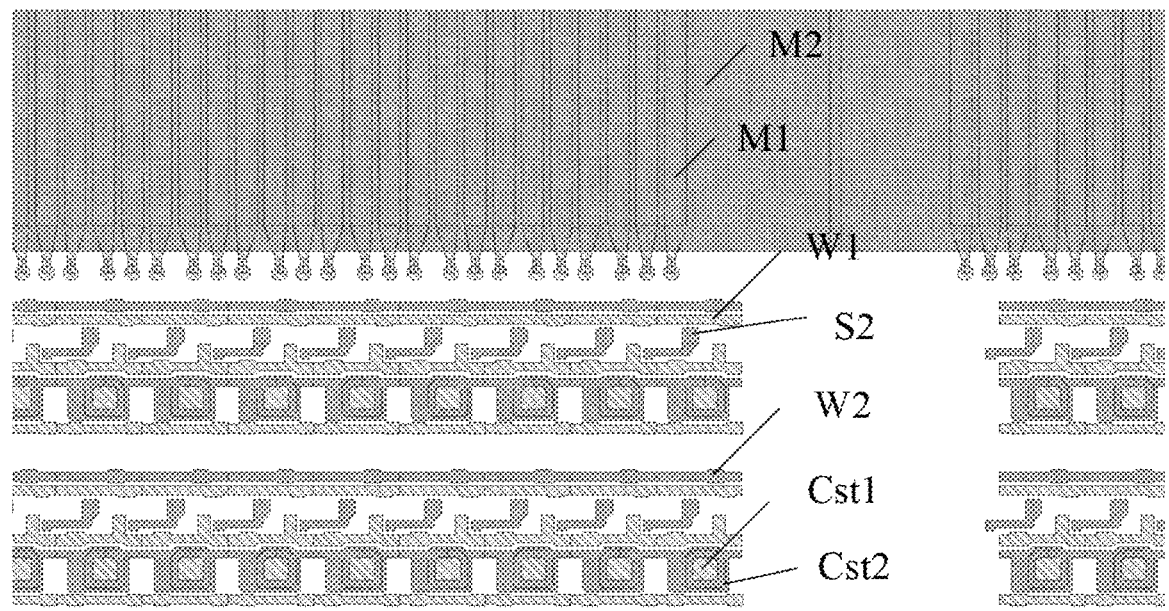
FIG. 7E is a schematic planar diagram of a stack of the first conductive layer and the second conductive layer in the display substrate illustrated in FIG. 7A.

FIG. 7E is a schematic planar diagram of a stack of the first conductive layer and the second conductive layer in the display substrate illustrated in FIG. 7A. For example, as illustrated in FIG. 7E, the capacitance electrode plate Cst1 and the capacitance electrode plate Cst2 overlap to form the storage capacitor Cst. The capacitance electrode plate M1 and the capacitance electrode plate M2 overlap to form a capacitance structure, and if the capacitance electrode plate M1 is coupled to the source electrode or drain electrode of the sixth transistor T6, the capacitance structure can be used as the first capacitance compensation structure. For example, in some embodiments, as illustrated in FIG. 7E, a shielding portion S2 may also be provided in the second conductive layer, and the shielding portion is used to shield the active layers of some thin film transistors (for example, the second transistor in FIG. 6A). For example, in some embodiments, the first power supply line may also be disposed in the second conductive layer. For example, the first power supply line may be coupled to the capacitance electrode plate M2 of the first capacitance compensation structure.

Figure 7F:
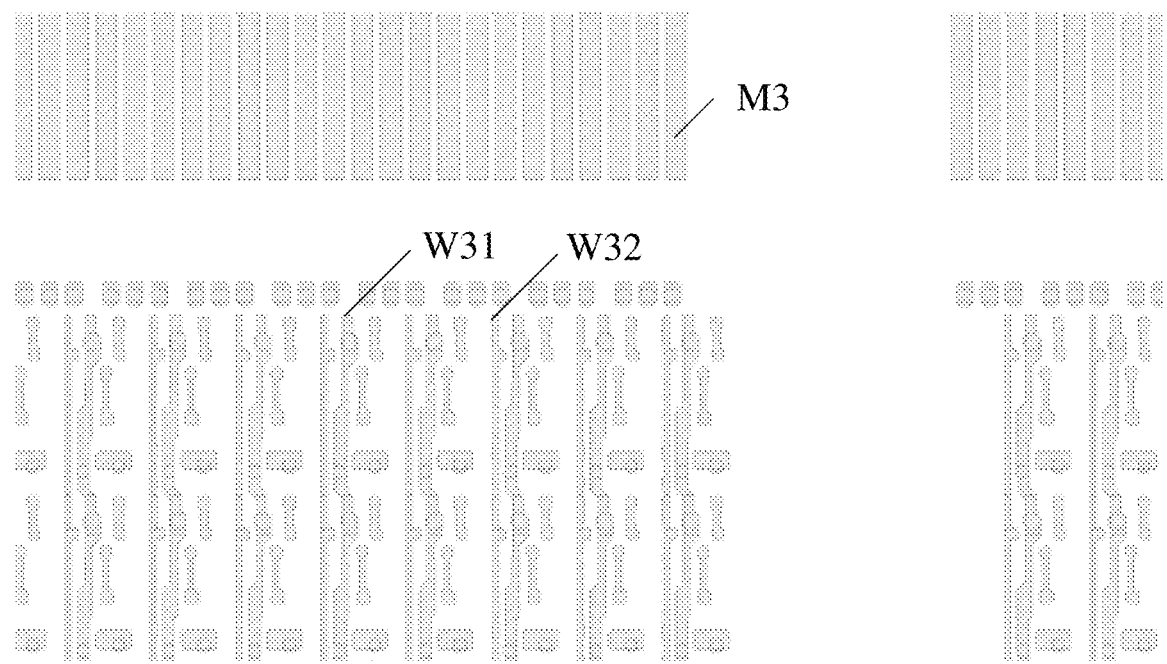
FIG. 7F is a schematic planar diagram of a third conductive layer in the display substrate illustrated in FIG. 7A.

FIG. 7F is a schematic planar diagram of a third conductive layer (i.e., the aforementioned first source-drain electrode layer SD1) in the display substrate illustrated in FIG. 7A. For example, in some embodiments, as illustrated in FIG. 7F, the capacitance electrode plate M3 of the first capacitance compensation structure, the first power supply line W31, the data signal line W32, etc. may all be located in the third conductive layer. It should be noted that the present disclosure includes but is not limited to this. For example, as illustrated in FIG. 7F, the capacitance electrode plates M3 of the respective first capacitance compensation structures are provided separately.

Figure 7G:
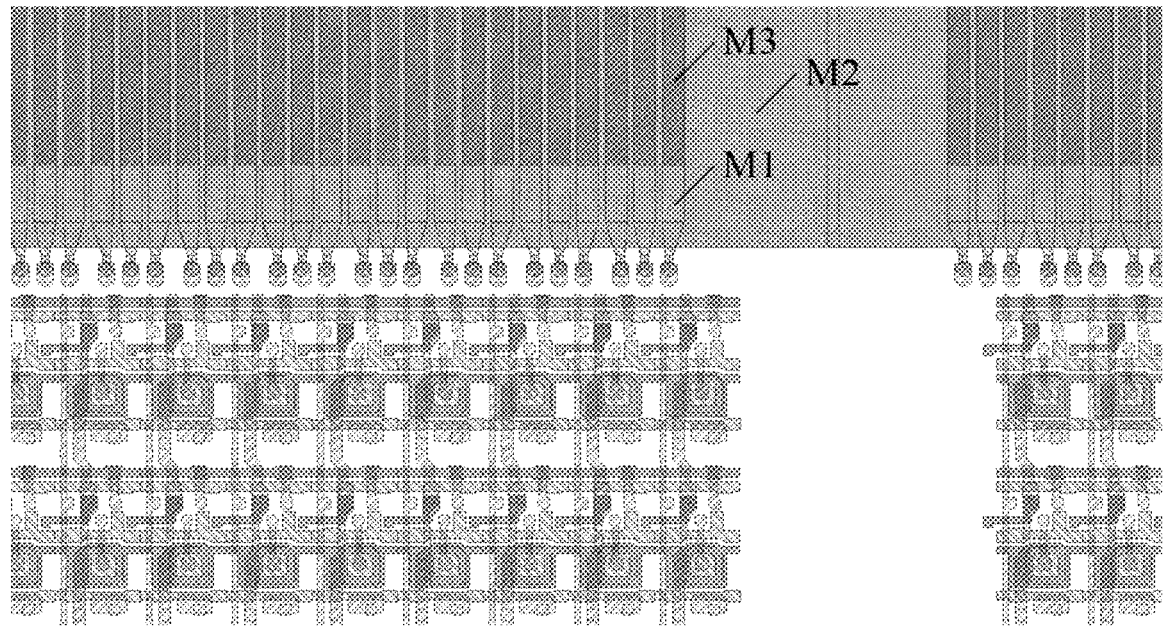
FIG. 7G is a schematic planar diagram of a stack of the first conductive layer, the second conductive layer, and the third conductive layer in the display substrate illustrated in FIG. 7A.

FIG. 7G is a schematic planar diagram of a stack of the first conductive layer, the second conductive layer, and the third conductive layer in the display substrate illustrated in FIG. 7A. For example, as illustrated in FIG. 7G, the capacitance electrode plate M3 and the capacitance electrode plate M2 overlap to form a capacitance structure. In this case, the first capacitance compensation structure can be a complex capacitance structure including three capacitance electrode plates (i.e., capacitance electrode plates M1-M3) provided in different layers, and at least one of the capacitance electrode plate M1 and the capacitance electrode plate M3 may be coupled to the source electrode or drain electrode of the sixth transistor T6. It should be understood that, for the first capacitance compensation structure, an additional capacitance electrode plate is further provided on the basis of the two capacitance electrode plates, and a method for adjusting the compensation capacitance value of the first capacitance compensation structure is added.

Figure 7H:
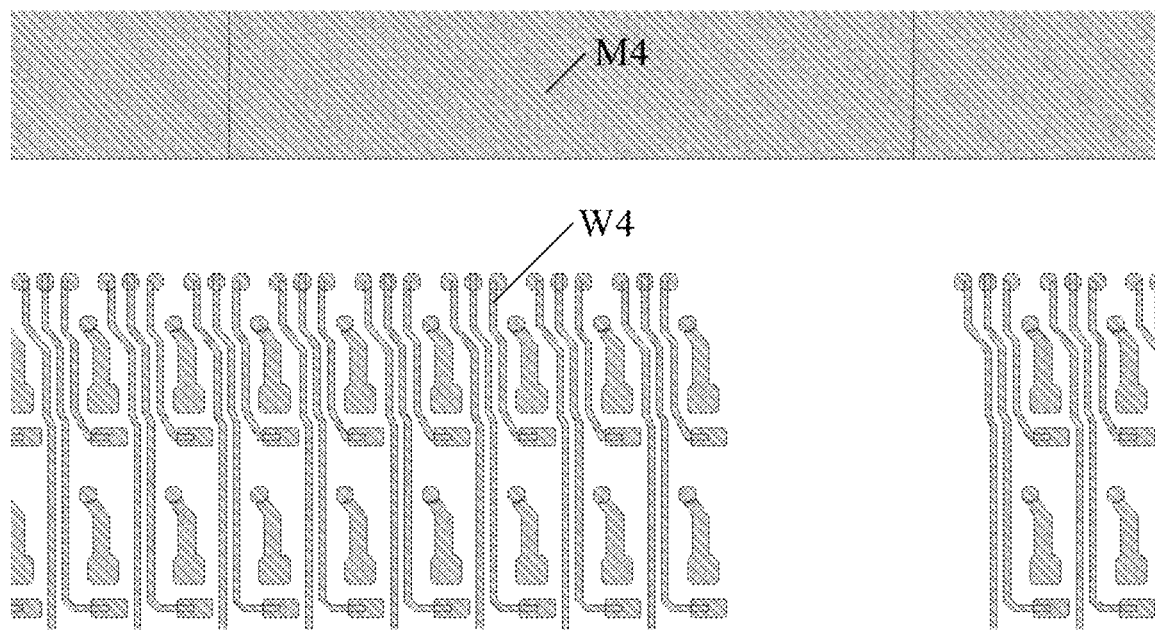
FIG. 7H is a schematic planar diagram of a fourth conductive layer in the display substrate illustrated in FIG. 7A.

FIG. 7H is a schematic planar diagram of a fourth conductive layer (i.e., the aforementioned second source-drain electrode layer SD2) in the display substrate illustrated in FIG. 7A. For example, in some embodiments, as illustrated in FIG. 7H, the capacitance electrode plate M4 of the first capacitance compensation structure, the wiring line W4 (for connecting the first pixel circuit and the first capacitance compensation structure), etc., may all be located in the fourth conductive layer. It should be noted that the present disclosure includes but is not limited to this. For example, as illustrated in FIG. 7H, the capacitance electrode plates M4 of the respective first capacitance compensation structures may be integrally provided, and the embodiments of the present disclosure include but are not limited to this. For example, one end of the wiring line W4 may be coupled to the source electrode or drain electrode of the sixth transistor T6, and the other end of the wiring line W4 may be coupled to at least one of the capacitance electrode plate M1 and the capacitance electrode plate M3.

Figure 7I:
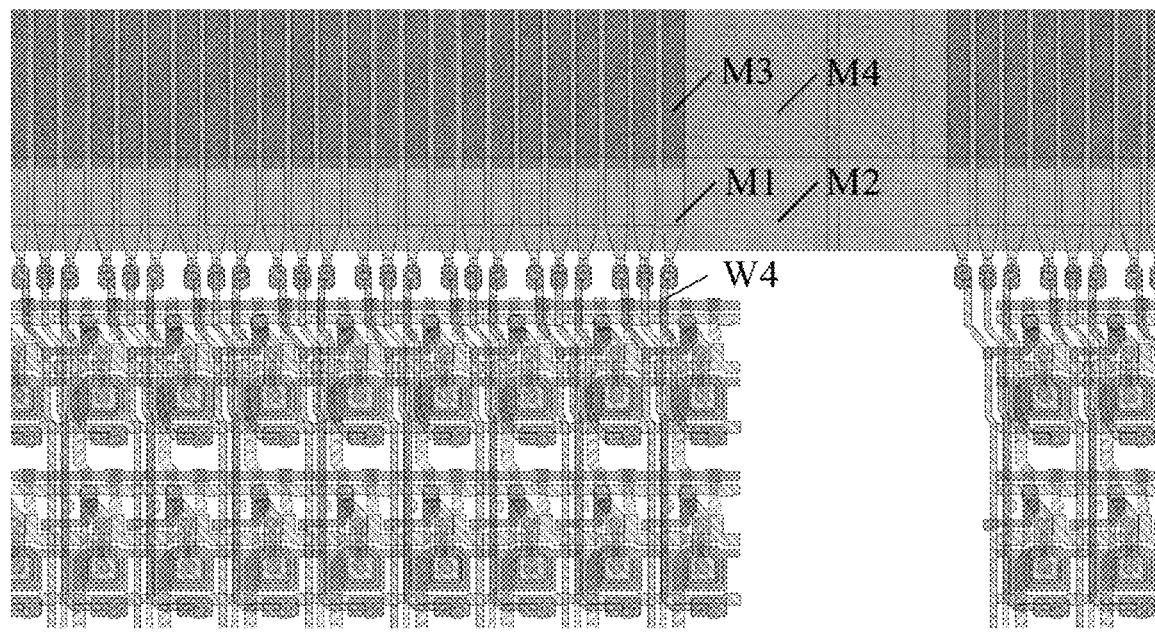
FIG. 7I is a schematic planar diagram of a stack of the first conductive layer, the second conductive layer, the third conductive layer, and the fourth conductive layer in the display substrate illustrated in FIG. 7A.

FIG. 7I is a schematic planar diagram of a stack of the first conductive layer, the second conductive layer, the third conductive layer, and the fourth conductive layer in the display substrate illustrated in FIG. 7A. For example, as illustrated in FIG. 7G, the first pixel circuit and the first capacitance compensation structure are electrically connected through the wiring line W4. In this case, the first capacitance compensation structure may be a complex capacitance structure including four capacitance electrode plates (i.e., capacitance electrode plates M1-M4) disposed in different layers, and at least one of the capacitance electrode plate M1 and the capacitance electrode plate M3 may be coupled to the source electrode or drain electrode of the sixth transistor T6. It should be understood that, for the first capacitance compensation structure, two additional capacitance electrode plates are further provided on the basis of the two capacitance electrode plates, which may further add the method of adjusting the compensation capacitance value of the first capacitance compensation structure.

It should be understood that, in the embodiments illustrated in FIG. 7C to FIG. 7I, each of the first capacitance compensation structures may include X capacitance electrode plates C0 (one capacitance electrode plate C0 of the first capacitance compensation structure is provided in each conductive layer) arranged in any X conductive layers of the above-mentioned four conductive layers (i.e., the first conductive layer, the second conductive layer, the third conductive layer, and the fourth conductive layer), where X=2, 3, and 4, the capacitance electrode plate C0 electrically connected with the first pixel circuit is separate in the conductive layer where it is located, and the capacitance electrode plate C0 not electrically connected to the first pixel circuit may be separate in the conductive layer where it is located, or may also be integrally provided with the other capacitance electrode plate C0 in the same conductive layer.

It should also be understood that, in the foregoing embodiments, the capacitance electrode plates of the first capacitance compensation structure are all in the shape of a long strip, and the present disclosure includes but is not limited to this. For example, according to actual needs, the capacitance electrode plate of the first capacitance compensation structure may also be in the shape of a wave shape, a polygonal line shape, or the like. Similarly, in the case that the display substrate includes the second capacitance compensation structure, the capacitance electrode plate of the second capacitance compensation structure may also be in the shape of a long strip, a wave shape, a polygonal line shape, or the like.

For example, referring to FIG. 1B, similar to the display substrate illustrated in FIG. 1B, the display substrate provided by the embodiments of the present disclosure may also include a first panel surface F1 and a second panel surface F2, and the first panel surface F1 is used for display during the operation of the display substrate. The first display region is a transparent display region, and is configured to transmit light incident from a side of the first panel surface F1 to a side of the second panel surface F2.

It should be noted that the embodiments of the present disclosure do not limit the shapes of the first display region, the first region, the second display region, the third display region, the peripheral region, and the like. For example, the first display region may be in any shape, such as a circle (as illustrated in FIG. 3A), a rectangle, a hexagon, an irregular shape, etc.

In the display substrate provided by the embodiments of the present disclosure, the parasitic capacitance of the transparent wiring line can be compensated by the first capacitance compensation structure, so that the luminous brightness of different first light-emitting elements may have better uniformity, so as to alleviate or solve the problem of uneven brightness in the first display region (especially the problem of uneven brightness when the first display region displays a low gray scale), thereby ameliorating the display effect of the first display region.

Figure 8:
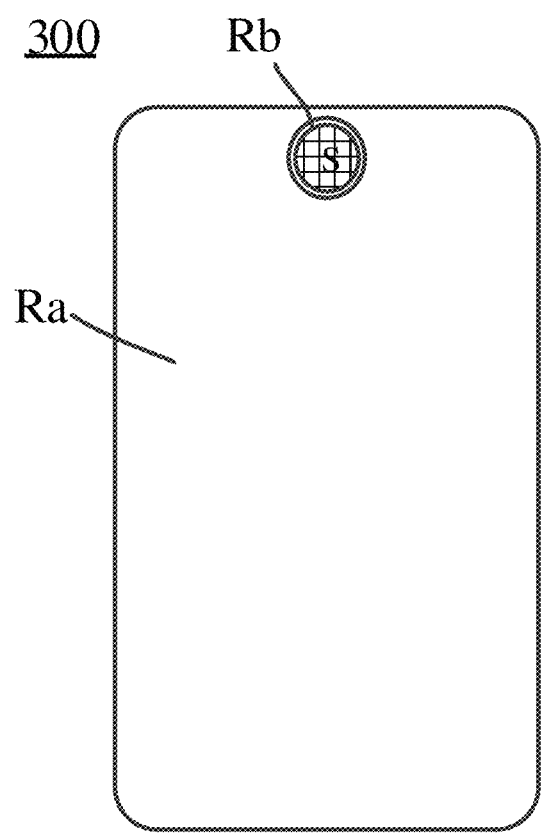
FIG. 8 is a schematic planar diagram of a display device provided by some embodiments of the present disclosure.

Some embodiments of the present disclosure further provide a display device. The display device includes the display substrate provided by any one of the embodiments of the present disclosure. FIG. 8 is a schematic planar diagram of a display device provided by some embodiments of the present disclosure. For example, as illustrated in FIG. 8, the display device 300 may include the display substrate illustrated in FIG. 3A and a sensor S.

For example, referring to FIG. 1B, similar to the display device 100 illustrated in FIG. 1B, in the display device 300, the sensor S (referring to the sensor 120 in the display device 100) may be disposed on a side of the second panel surface F2 of the display substrate (referring to the display substrate 110 in the display device 100). For example, as illustrated in FIG. 1B and FIG. 8, the orthographic projection of the sensor S on the display substrate at least partially overlaps with the first display region Rb, and the sensor S is configured to receive the light incident from the side of the first panel surface F1.

For example, the sensor S and the first display region Rb are stacked in the normal direction of the display substrate (i.e., the direction perpendicular to the first panel surface F1 or the second panel surface F2 of the display substrate), the sensor S can receive and process an optical signal passing through the first display region Rb, and the optical signal may be visible light, infrared light, or the like. For example, the first display region Rb allows the light incident from the side of the first panel surface F1 to be at least partially transmitted to the side of the second panel surface F2. For example, only light-emitting elements (i.e., the first light-emitting elements) are provided in the first display region Rb, but no pixel circuits (i.e., the first pixel circuits) are provided in the first display region Rb. In this case, the light transmittance of the first display region Rb can be improved.

For example, in some embodiments, the orthographic projection of the sensor S on the display substrate is located in the first display region Rb when the direct type setting is adopted. For example, in other embodiments, when other light guiding elements (such as a light guiding plate, a light guiding tube, etc.) are used to allow the light to be transmitted on the sensor S from, for example, a direction parallel to the display substrate (i.e., a direction parallel to the first panel surface F1 or the second panel surface F2 of the display substrate), the orthographic projection of the sensor S on the display substrate partially overlaps with the first display region Rb. In this case, because the light can propagate laterally to the sensor S, it is not required that the sensor S is located completely directly below the first display region Rb.

For example, the sensor S may be an image sensor, which may be used to collect an image of the external environment facing the light collecting surface of the sensor S. For example, the image sensor may be a CMOS image sensor or a CCD image sensor. The sensor S may also be an infrared sensor, a distance sensor, or the like. For example, in the case that the display device 300 is a mobile terminal such as a mobile phone, a notebook computer, etc., the sensor S may be implemented as a camera of the mobile terminal such as a mobile phone, a notebook computer, etc., and may also include optical devices such as a lens, a reflector, an optical wave-guide, or the like as required, to modulate the optical path. For example, the sensor S may include photosensitive pixels arranged in an array. For example, each photosensitive pixel may include a photodetector (e.g., a photodiode, a phototransistor) and a switching transistor (e.g., a thin film transistor). For example, the photodiode can convert an optical signal irradiated thereon into an electrical signal, and the switching transistor can be electrically connected to the photodiode to control whether the photodiode is in the state of collecting the optical signal and the time of collecting the optical signal.

The display device 300 may be any electronic device having a display function, such as a smart phone, a notebook computer, a tablet computer, a TV, etc. For example, when the display device 300 is a smart phone or a tablet computer, the smart phone or the tablet computer may have a full-screen design. For example, for the display substrate illustrated in FIG. 3B and FIG. 3C, the peripheral region 40, which cannot be used for display, may be bent to the side or back of the display device, thereby achieving a full-screen design. Of course, for the display substrate illustrated in FIG. 3C, the display substrate may also not include the peripheral region 40, so as to achieve a full panel design. In addition, the smart phone or the tablet computer may also perform image capturing, distance sensing, light intensity sensing, and other operations through the under-screen sensor (such as a camera, an infrared sensor, etc.).

It should be noted that, for the sake of clarity and conciseness, the entire structure of the display device 300 is not given. In order to achieve the necessary functions of the display device, those skilled in the art can set other structures not shown according to specific application scenarios, and the embodiments of the present disclosure are not limited in this aspect.

The technical effects of the display device provided by the embodiments of the present disclosure may refer to the corresponding description of the display substrate in the above-mentioned embodiments, which will not be repeated here.

For the present disclosure, the following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto. Any modifications or substitutions that easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising a first display region and a first region at least partially surrounding the first display region,
   wherein the first display region comprises a plurality of first light-emitting elements;
   the first region comprises a plurality of first pixel circuits and at least one first capacitance compensation structure;
   the display substrate comprises a plurality of transparent wiring lines extending from the first region to the first display region;
   at least one first pixel circuit of the plurality of first pixel circuits is electrically connected to at least one first light-emitting element of the plurality of first light-emitting elements through at least one transparent wiring line of the plurality of transparent wiring lines, and the at least one first pixel circuit is configured to control a driving current, for driving the at least one first light-emitting element to emit light, flowing through the at least one first pixel circuit, the at least one transparent wiring line, and the at least one first light-emitting element;
   the at least one first capacitance compensation structure is coupled to at least one transparent wiring line of the plurality of transparent wiring lines, and is configured to compensate for a parasitic capacitance caused by the at least one transparent wiring line coupled to the at least one first capacitance compensation structure;
   the first region comprises a second display region, the second display region at least partially surrounds the first display region, and the second display region comprises a second pixel unit;
   the second pixel unit comprises a second light-emitting element and a second pixel circuit;
   the second pixel circuit is electrically connected to the second light-emitting element, and is configured to control a driving current, for driving the second light-emitting element to emit light, flowing through the second pixel circuit and the second light-emitting element; and
   in a case that the plurality of first pixel circuits and the at least one first capacitance compensation structure are in the second display region, in a plane of the display substrate, a first capacitance compensation structure is on a side of a first pixel circuit corresponding to the first capacitance compensation structure away from the first display region.

2. The display substrate according to claim 1, wherein a compensation capacitance provided by the at least one first capacitance compensation structure is connected in parallel with the parasitic capacitance caused by the at least one transparent wiring line coupled to the at least one first capacitance compensation structure.

3. The display substrate according to claim 2, wherein a sum of a value of the parasitic capacitance of the at least one transparent wiring line coupled to the at least one first capacitance compensation structure and a value of the compensation capacitance of the at least one first capacitance compensation structure is approximately equal to a target capacitance value.

4. The display substrate according to claim 3, wherein the target capacitance value is greater than or equal to a maximum value among parasitic capacitance values of the plurality of transparent wiring lines.

5. The display substrate according to claim 4, wherein a parasitic capacitance value of one or more transparent wiring lines comprised in the plurality of transparent wiring lines is approximately equal to the target capacitance value, and the one or more transparent wiring lines are not coupled to the at least one first capacitance compensation structure.

6. The display substrate according to claim 1, wherein the plurality of transparent wiring lines are divided into a plurality of transparent wiring line groups, and each transparent wiring line group in the plurality of transparent wiring line groups comprises at least one transparent wiring line;
- an average value of a parasitic capacitance value of the at least one transparent wiring line in the each transparent wiring line group serves as an average parasitic capacitance value of the each transparent wiring line group; and
- the target capacitance value is greater than or equal to a maximum value among average parasitic capacitance values of the plurality of transparent wiring line groups.

7. The display substrate according to claim 6, wherein an average parasitic capacitance value of at least one transparent wiring line group in the plurality of transparent wiring line groups is approximately equal to the target capacitance value, and at least one transparent wiring line in the at least one transparent wiring line group is not coupled to the at least one first capacitance compensation structure.

8. The display substrate according to claim 1, wherein the first region comprises a peripheral region, the peripheral region is between the first display region and at least one side edge of the display substrate, and the plurality of first pixel circuits and the at least one first capacitance compensation structure are in the peripheral region.

9. The display substrate according to claim 1, wherein the first region further comprises a peripheral region and the peripheral region is between the first display region and at least one side edge of the display substrate; and
- a part of the plurality of first pixel circuits and a part of the at least one first capacitance compensation structure are in the peripheral region, and another part of the plurality of first pixel circuits and another part of the at least one first capacitance compensation structure are in the second display region.

10. The display substrate according to claim 1, wherein the second display region further comprises a second capacitance compensation structure,
- the second capacitance compensation structure is coupled to the second pixel circuit and the second light-emitting element, and is configured to provide a compensation capacitance to the second pixel circuit, and
- a compensation capacitance value of the second capacitance compensation structure is approximately equal to a target capacitance value.

11. The display substrate according to claim 1, wherein the display substrate comprises a base substrate, a pixel circuit layer, a transparent wiring line layer, and a light-emitting element layer, and the pixel circuit layer, the transparent wiring line layer, and the light-emitting element layer are sequentially arranged on the base substrate; the pixel circuit layer comprises a gate electrode layer and a source-drain electrode layer;
- each first light-emitting element in the plurality of first light-emitting elements is in the light-emitting element layer;
- each first pixel circuit in the plurality of first pixel circuits comprises a thin film transistor, the thin film transistor comprises a gate electrode, a source electrode, and a drain electrode, the gate electrode is in the gate electrode layer, and at least one of the source electrode and the drain electrode is in the source-drain electrode layer;
- each transparent wiring line in the plurality of transparent wiring lines is in the transparent wiring line layer; and
- the at least one first capacitance compensation structure comprises a first capacitance electrode and a second capacitance electrode, and one of the first capacitance electrode and the second capacitance electrode is in the gate electrode layer, the source-drain electrode layer, or the transparent wiring line layer.

12. The display substrate according to claim 11, wherein the source electrode or the drain electrode is electrically connected to one of the first capacitance electrode and the second capacitance electrode, and the source electrode or the drain electrode is further electrically connected to the first light-emitting element through the transparent wiring line.

13. The display substrate according to claim 12, wherein the pixel circuit layer further comprises a capacitance electrode plate layer, and another of the first capacitance electrode and the second capacitance electrode is in the capacitance electrode plate layer.

14. The display substrate according to claim 13, wherein the at least one first capacitance compensation structure comprises a plurality of capacitance compensation structures, and first capacitance electrodes or second capacitance electrodes of the plurality of capacitance compensation structures are an integral structure.

15. The display substrate according to claim 1, wherein the display substrate comprises a first panel surface and a second panel surface, and the first panel surface is used for display during operation of the display substrate; and
- the first display region is a transparent display region, and is configured to allow light incident from a side of the first panel surface to transmit to a side of the second panel surface.

16. A display device, comprising a display substrate,
- wherein the display substrate comprises a first display region and a first region at least partially surrounding the first display region;
- the first display region comprises a plurality of first light-emitting elements;
- the first region comprises a plurality of first pixel circuits and at least one first capacitance compensation structure;
- the display substrate comprises a plurality of transparent wiring lines extending from the first region to the first display region;
- at least one first pixel circuit of the plurality of first pixel circuits is electrically connected to at least one first light-emitting element of the plurality of first light-emitting elements through at least one transparent wiring line of the plurality of transparent wiring lines, and the at least one first pixel circuit is configured to control a driving current, for driving the at least one first light-emitting element to emit light, flowing through the at least one first pixel circuit, the at least one transparent wiring line, and the at least one first light-emitting element;

the at least one first capacitance compensation structure is coupled to at least one transparent wiring line of the plurality of transparent wiring lines, and is configured to compensate for a parasitic capacitance caused by the at least one transparent wiring line coupled to the at least one first capacitance compensation structure;

the first region comprises a second display region, the second display region at least partially surrounds the first display region, and the second display region comprises a second pixel unit;

the second pixel unit comprises a second light-emitting element and a second pixel circuit;

the second pixel circuit is electrically connected to the second light-emitting element, and is configured to control a driving current, for driving the second light-emitting element to emit light, flowing through the second pixel circuit and the second light-emitting element; and in a case that the plurality of first pixel circuits and the at least one first capacitance compensation structure are in the second display region, in a plane of the display substrate, a first capacitance compensation structure is on a side of a first pixel circuit corresponding to the first capacitance compensation structure away from the first display region.

17. The display device according to claim 16, further comprising a sensor, wherein the display substrate comprises a first panel surface and a second panel surface, and the first panel surface is used for display during operation;

the first display region is a transparent display region, and is configured to allow light incident from a side of the first panel surface to transmit to a side of the second panel surface; and the sensor is provided on the side of the second panel surface of the display substrate, an orthographic projection of the sensor on the display substrate at least partially overlaps with the first display region, and the sensor is configured to receive the light incident from the side of the first panel surface.

18. The display device according to claim 17, wherein the sensor comprises at least one of a group consisting of an image sensor, an infrared sensor, and a distance sensor.

* * * * *